(12) United States Patent
Liu et al.

(10) Patent No.: US 12,101,091 B2
(45) Date of Patent: Sep. 24, 2024

(54) DECOUPLING CAPACITOR CIRCUITS

(71) Applicant: TAIWAN SEMICONDUCTOR MANUFACTURING COMPANY, LTD., Hsinchu (TW)

(72) Inventors: Szu-Lin Liu, Hsinchu (TW); Jaw-Juinn Horng, Hsinchu (TW); Yi-Hsiang Wang, Hsinchu (TW); Wei-Lin Lai, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 18/306,469

(22) Filed: Apr. 25, 2023

(65) Prior Publication Data

US 2023/0268911 A1    Aug. 24, 2023

Related U.S. Application Data

(62) Division of application No. 17/410,545, filed on Aug. 24, 2021, now Pat. No. 11,671,084.

(60) Provisional application No. 63/185,817, filed on May 7, 2021.

(51) Int. Cl.
| | |
|---|---|
| *H03K 5/12* | (2006.01) |
| *H01L 21/8234* | (2006.01) |
| *H01L 27/06* | (2006.01) |
| *H01L 29/94* | (2006.01) |
| *H03K 5/1252* | (2006.01) |
| *H03K 19/0185* | (2006.01) |

(52) U.S. Cl.
CPC ............ *H03K 5/1252* (2013.01); *H01L 21/823437* (2013.01); *H01L 21/823475* (2013.01); *H01L 27/0629* (2013.01); *H01L 29/94* (2013.01); *H03K 19/018521* (2013.01)

(58) Field of Classification Search
CPC .... G06F 1/3203; H02J 9/005; H03K 19/0008; H03K 19/0013; H03K 19/0016
See application file for complete search history.

(56) References Cited

U.S. PATENT DOCUMENTS

| | | | | |
|---|---|---|---|---|
| 5,544,102 | A | * | 8/1996 | Tobita ................ G11C 11/4085 365/175 |
| 5,959,927 | A | * | 9/1999 | Yamagata ................ G11C 7/22 365/63 |
| 7,260,442 | B2 | | 8/2007 | Hwang et al. |
| 7,829,973 | B2 | | 11/2010 | Schultz et al. |
| 9,256,709 | B2 | | 2/2016 | Yu et al. |
| 2005/0073354 | A1 | * | 4/2005 | Abadeer ................ H02M 3/003 257/E27.047 |
| 2005/0275449 | A1 | | 12/2005 | Chen |

(Continued)

*Primary Examiner* — Quan Tra
(74) *Attorney, Agent, or Firm* — Hauptman Ham, LLP

(57) ABSTRACT

A method includes fabricating a first transistor and a second transistor on a substrate and fabricating a first conducting line and a second conducting line in a first metal layer. The method also includes connecting a gate of the first transistor to the first conducting line and connecting a gate of the second transistor to the second conducting line. The first conducting line and the second conducting line are parallel and adjacent to each other in the first metal layer above the first transistor and the second transistor. The method still includes connecting a source and a drain of the first transistor to a third conducting line.

20 Claims, 21 Drawing Sheets

(56) References Cited

U.S. PATENT DOCUMENTS

| | | |
|---|---|---|
| 2008/0278221 A1 | 11/2008 | Rowland |
| 2009/0128992 A1 | 5/2009 | Haralabidis et al. |
| 2009/0244971 A1 | 10/2009 | Lee et al. |
| 2010/0060322 A1* | 3/2010 | Coenen ............... H03K 19/0013 |
| | | 326/103 |
| 2014/0040838 A1 | 2/2014 | Liu et al. |
| 2015/0236014 A1 | 8/2015 | Gathman |
| 2015/0278429 A1 | 10/2015 | Chang |
| 2017/0330874 A1* | 11/2017 | Robins ............... H03K 19/0948 |

* cited by examiner

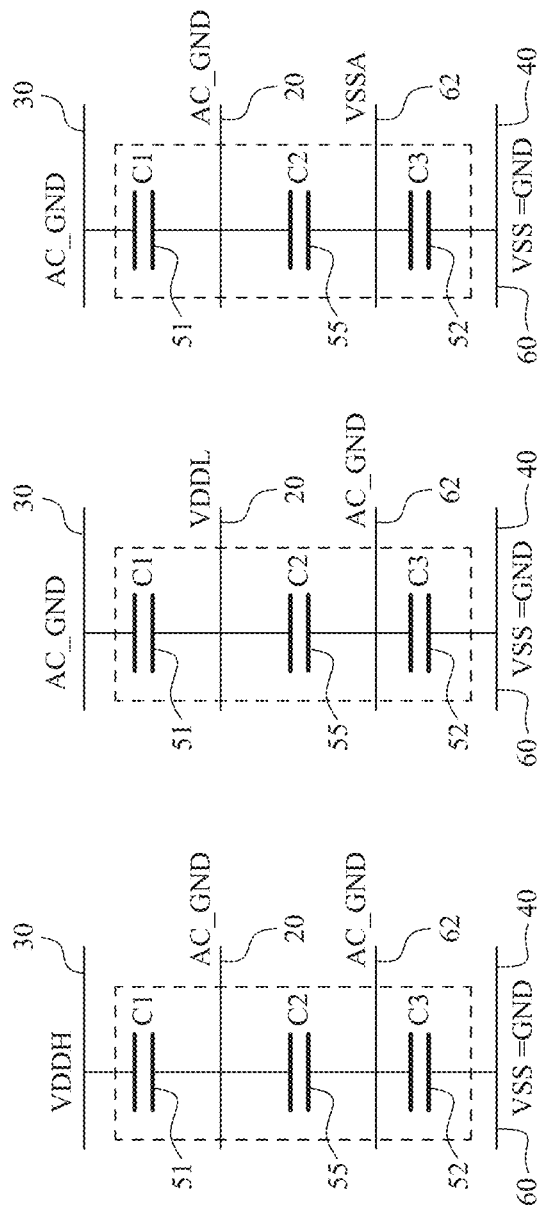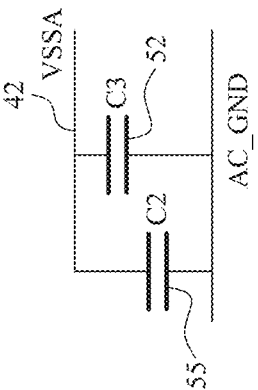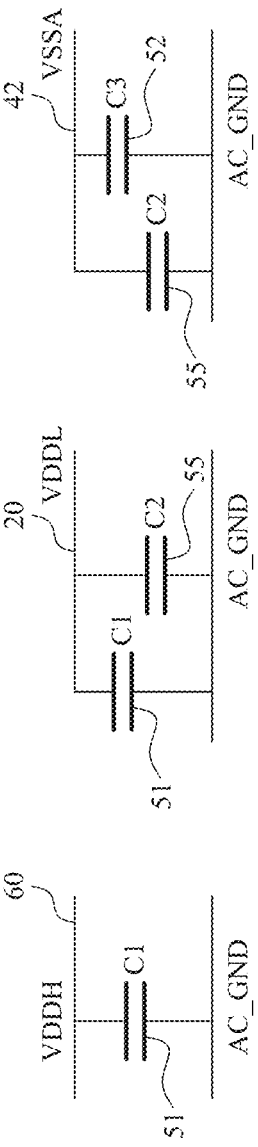

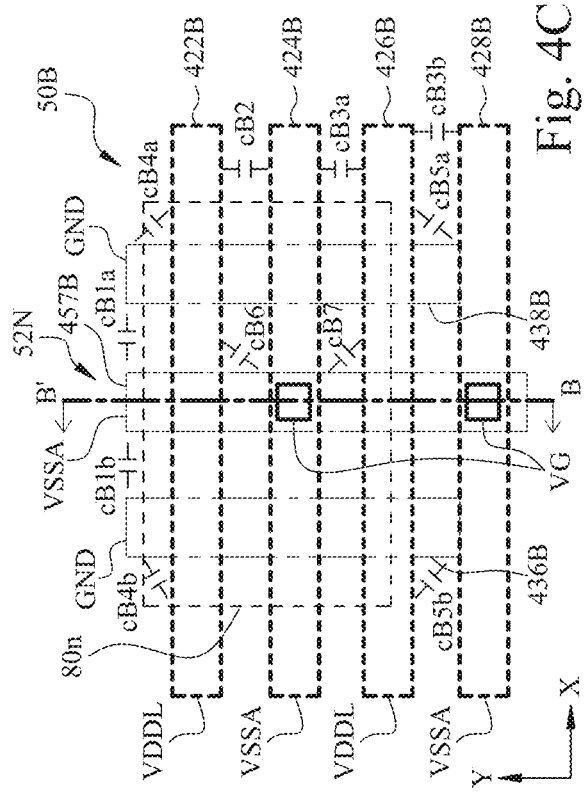
Fig. 4B
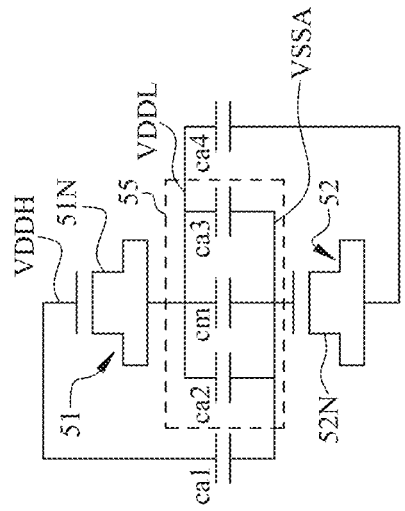
Fig. 4D
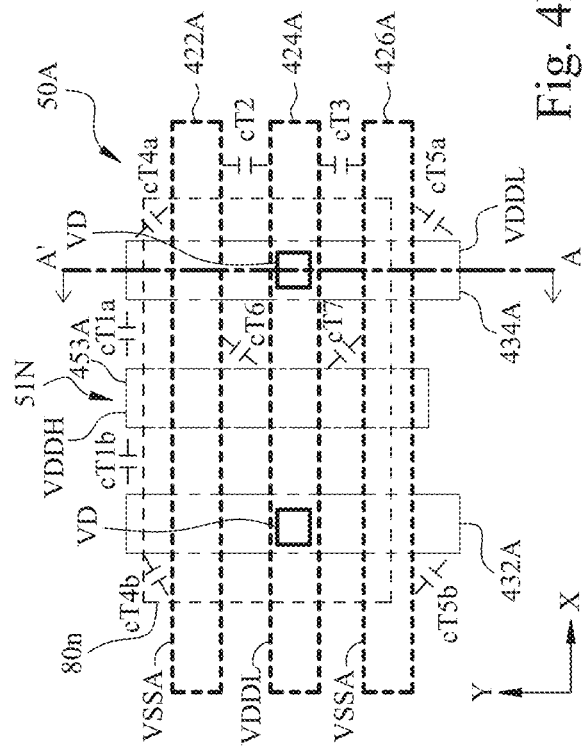
Fig. 4C
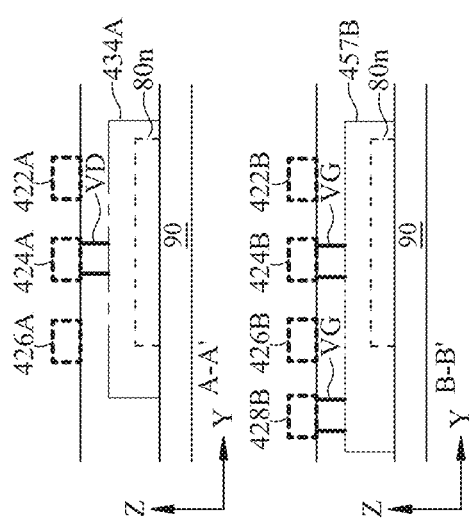
Fig. 4F
Fig. 4E

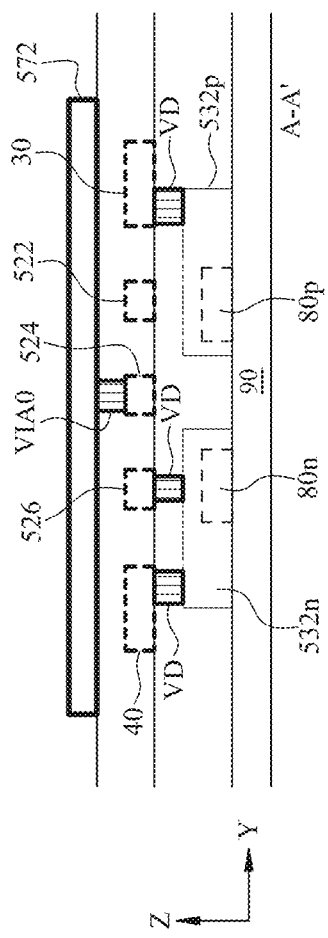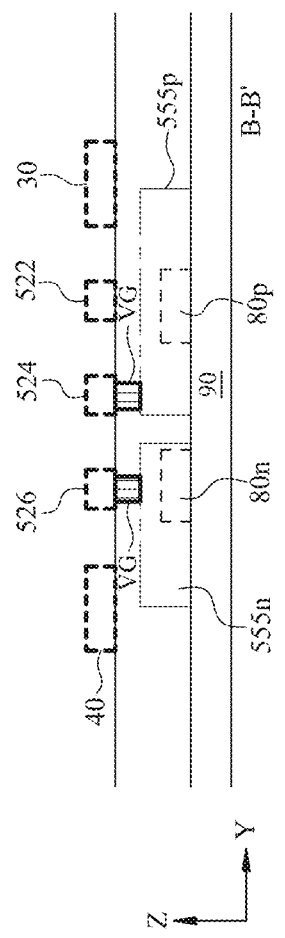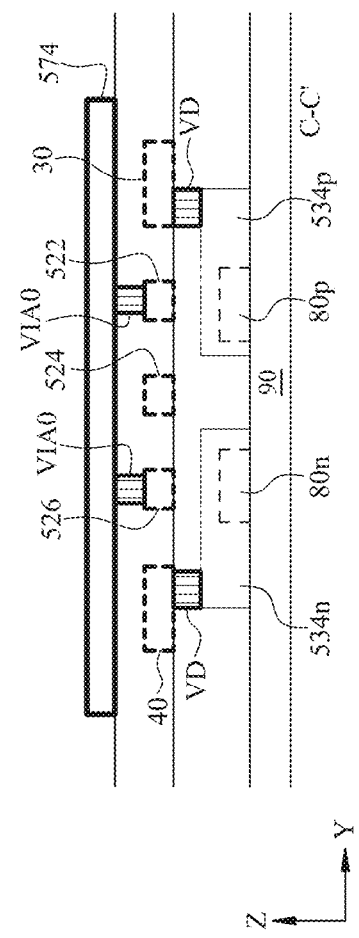

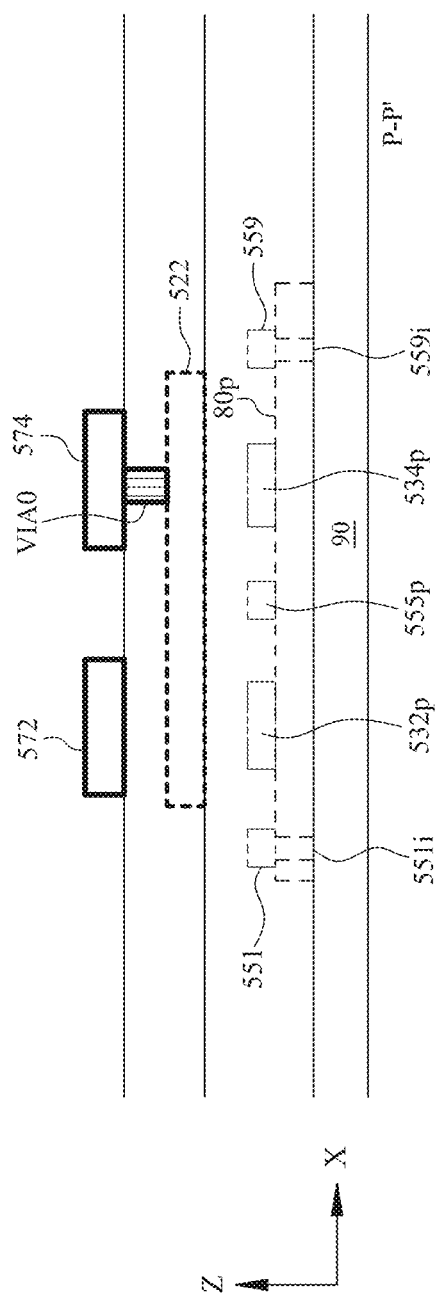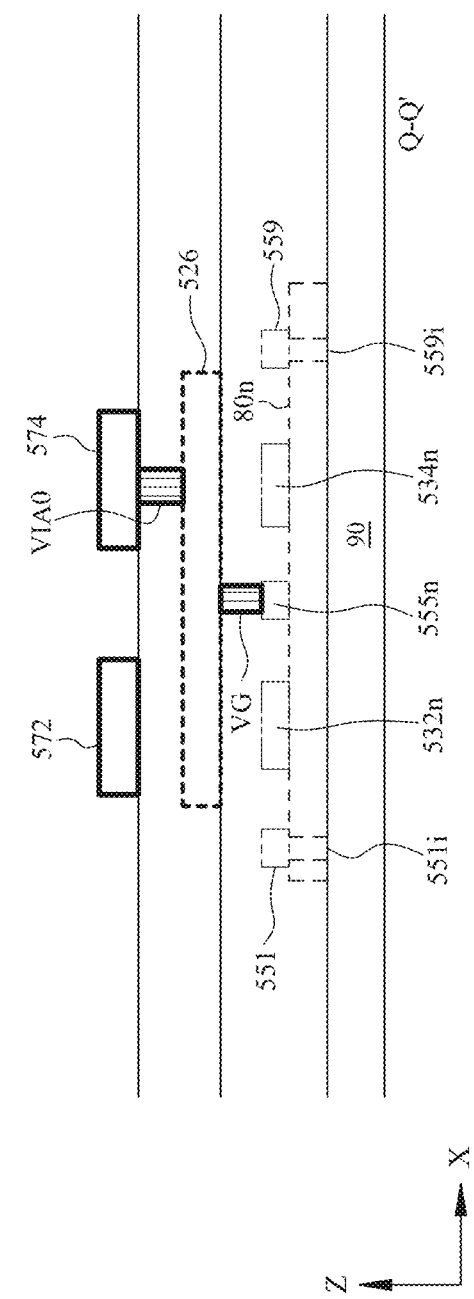

DECOUPLING CAPACITOR CIRCUITS

PRIORITY CLAIM AND CROSS-REFERENCE

The present application is a divisional of U.S. application Ser. No. 17/410,545, filed on Aug. 24, 2021, which claims priority to U.S. Provisional Application No. 63/185,817, filed May 7, 2021, each of which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C and FIGS. 2Aa-2Ca are circuit diagrams of various equivalent circuits of the decoupling capacitor circuit, in accordance with some embodiments.

FIGS. 4B-4C are layout diagrams of the capacitive sub-circuits in FIG. 4A, in accordance with some embodiments.

FIGS. 4D-4E are cross-sectional views of the capacitive sub-circuits, in accordance with some embodiments.

FIG. 4F is an equivalent circuit of the capacitive sub-circuits, in accordance with some embodiments.

FIGS. 5B1-5B3 and FIGS. 5C1-5C2 are cross-sectional views of the decoupling capacitor circuit, in accordance with some embodiments.

DETAILED DESCRIPTION

Figure 1A:
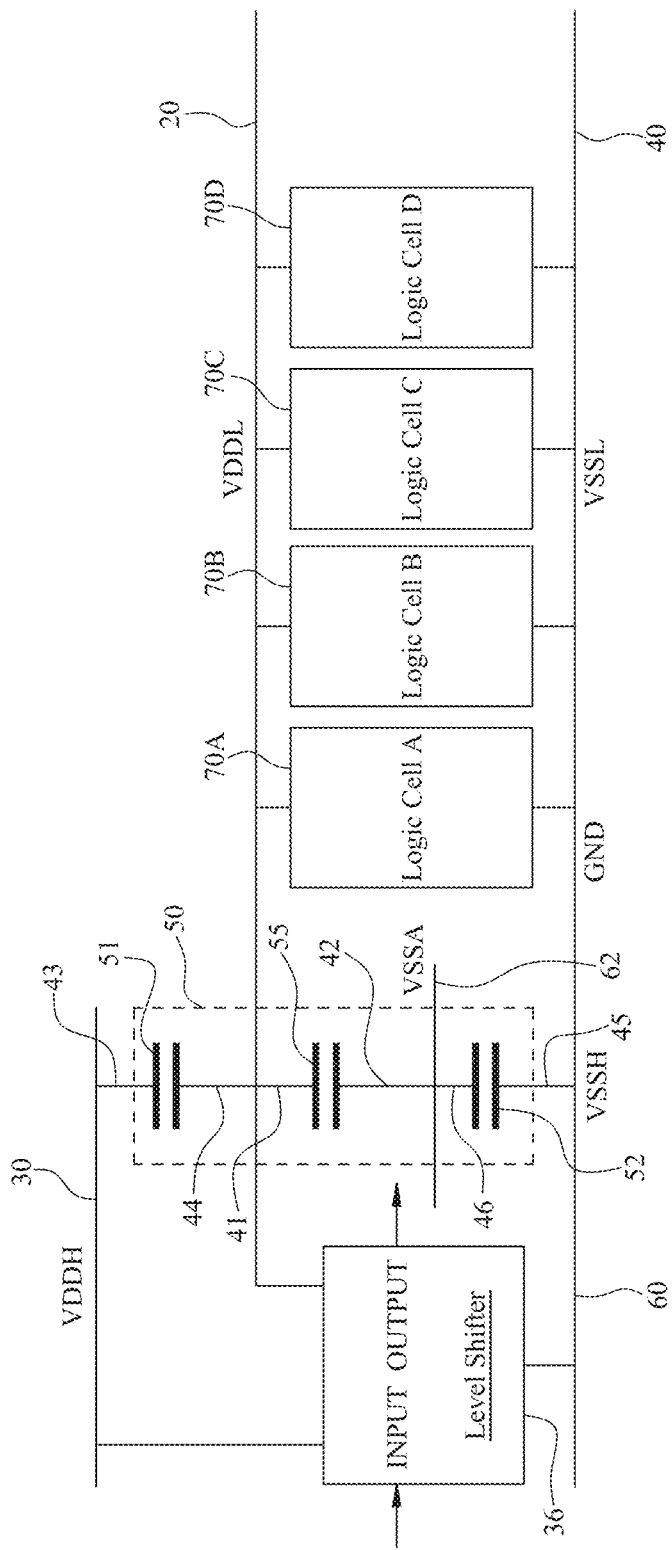
FIGS. 1A-1D are circuit diagrams of decoupling capacitor circuits, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the supply voltages for the circuits in a higher voltage domain (such as an input-output domain) are provided by an upper voltage (e.g., VDDH) and a lower voltage (e.g., VSSH) of the higher voltage domain. The supply voltages for the circuits in a lower voltage domain (such as a core logic domain) are provided by an upper voltage (e.g., VDDL) and a lower voltage (e.g., VSSL) of the lower voltage domain. In some embodiments, a decoupling capacitor circuit includes a first metal-insulator-semiconductor capacitor, a metal-insulator-metal capacitor, and a second metal-insulator-semiconductor capacitor all serially connected between the upper voltage and the lower voltage of the higher voltage domain. The metal-insulator-metal capacitor and the second metal-insulator-semiconductor capacitor are serially connected between the upper voltage and the lower voltage of the lower voltage domain. The metal-insulator-metal capacitor is conductively connected between the upper voltage of the lower voltage domain and an alternative supply voltage (e.g., VSSA) of the lower voltage domain. The first metal-insulator-semiconductor capacitor and the second metal-insulator-semiconductor capacitor are implemented with MOS transistors designed for operating in the lower voltage domain, even though the decoupling capacitor circuit reduces voltage noise and fluctuation in both the supply voltages of the higher voltage domain and the supply voltages of the lower voltage domain. In some embodiments, parts of the metal-insulator-metal capacitor are stacked with the MOS transistors in the decoupling capacitor circuit, whereby the layout areas for implementing the decoupling capacitor circuit 50 are reduced.

FIGS. 1A-1D are circuit diagrams of decoupling capacitor circuits, in accordance with some embodiments. In each of the circuits in FIGS. 1A-1D, the decoupling capacitor circuit 50 includes a first metal-insulator-semiconductor capacitor 51, a second metal-insulator-semiconductor capacitor 52, and a metal-insulator-metal capacitor 55. The decoupling capacitor circuit 50 is coupled to both the circuits in a higher voltage domain and the circuits in a lower voltage domain. The circuits in the higher voltage domain are powered by an upper voltage VDDH and a lower voltage VSSH. The circuits in the lower voltage domain are powered by an upper voltage VDDL and a lower voltage VSSL. The voltage difference between the upper voltage VDDH and the lower voltage VSSH (in the higher voltage domain) is larger than the voltage difference between the upper voltage VDDL and the lower voltage VSSL (in the lower voltage domain). As a specific non-limiting example, in some implementations of the integrated circuit, the voltage difference in the higher voltage domain is 1.2V, while the voltage difference in the lower voltage domain is 0.75V.

An example of the higher voltage domain is the input-output domain, and an example of the lower voltage domain is the core logic domain. When the input-output circuit in the input-output domain receives input logic signals from an external circuit with a logic voltage swing larger than what is required by the core logic domain, the input-output circuit converts the input logic voltage levels (e.g., 1.2V for logic HIGH signals) of the received input logic signals to corresponding logic voltage levels (e.g., 0.75V for logic HIGH signals) that are acceptable to the circuits in the core logic domain. Additionally, when the input-output circuit in the input-output domain receives outbound logic signals from the circuits in the core logic domain, if the logic voltage levels (e.g., 0.75V for logic HIGH signals) of the outbound logic signals from the core logic domain are not acceptable to the external circuit, the input-output circuit in the input-output domain then converts the logic voltage levels (e.g., 0.75V for logic HIGH signals) of the outbound logic signals to corresponding acceptable logic voltage levels (e.g., 1.2V for logic HIGH signals) for the external circuit. In FIGS. 1A-1D, the conversion of the input logic voltage levels (e.g., 1.2V for logic HIGH signals) of the received input logic signals from the external circuit to corresponding logic voltage levels (e.g., 0.75V for logic HIGH signals) for the circuits in the core logic domain is provided by a level shifter 36. In some embodiments, the level shifter 36 is also implemented to generate an output logic signal for the external circuit by converting an outbound logic signal from the circuits in the core logic domain.

Generally, the transistor designs for implementing the logic cells in the lower voltage domain are different from the transistor designs for implementing the various circuits (such as the input-output circuits) in the higher voltage domain. The transistor in the lower voltage domain and the transistor in the higher voltage domain have different design goals for speed, power consumption, and device occupied area. The gate dielectric of the transistors in the lower voltage domain are typically thinner than the gate dielectric of the transistors in the higher voltage domain. The normal operation voltage of the transistors in the lower voltage domain is smaller than the normal operation voltage of the transistors in the higher voltage domain, and the maximal operation voltage of the transistors in the lower voltage domain is smaller than the maximal operation voltage of the transistors in the higher voltage domain.

In FIGS. 1A-1D, the lower voltage VSSH in the higher voltage domain and the lower voltage VSSL in the lower voltage domain are maintained at the ground voltage GND. The level shifter 36 in the input-output circuit is connected to both the upper voltage VDDH in the higher voltage domain and the upper voltage VDDL in the lower voltage domain. The level shifter 36 is also connected to the ground voltage GND. Each of the logic cells 70A-70D in the lower voltage domain (e.g., the core logic domain) is connected between a power rail 20 and a power rail 40. The power rail 20 is maintained at the first supply voltage (e.g., the upper voltage VDDL) for the lower voltage domain, and the power rail 40 is maintained at the second supply voltage (e.g., the lower voltage VSSL) for the lower voltage domain. Examples of the logic cell in the lower voltage domain include various logic cells (such as, a buffer cell, an inverter cell, an NAND cell, an NOR cell, an AND cell, an OR cell, or an AOI cell or the like) and/or various flip-flop cells (such as a D flip-flop cell or the like).

In FIGS. 1A-1D, the decoupling capacitor circuit 50 includes a first metal-insulator-semiconductor capacitor 51, a second metal-insulator-semiconductor capacitor 52, and a metal-insulator-metal capacitor 55 serially connected between a power node 30 and a power node 60. Each of the power node 30 and the power node 60 is a circuit node interpreted within the context of a netlist in a SPICE file. The power node 30 is configured to have a first reference voltage (e.g., the upper voltage VDDH) for the higher voltage domain, and the power node 60 is configured to have a second reference voltage (e.g., the lower voltage VSSH) for the higher voltage domain. A terminal 43 of the first metal-insulator-semiconductor capacitor 51 is conductively connected to the power node 30. A terminal 44 of the first metal-insulator-semiconductor capacitor 51 is conductively connected to both a power rail 20 and a terminal 41 of the metal-insulator-metal capacitor 55. The metal-insulator-metal capacitor 55 is conductively connected between the power rail 20 and a connection node 62, which is a circuit node interpreted within the context of a netlist in a SPICE file. A terminal 46 of the second metal-insulator-semiconductor capacitor 52 is conductively connected to a terminal 42 of the metal-insulator-metal capacitor 55. A terminal 45 of the second metal-insulator-semiconductor capacitor 52 is conductively connected to the power node 60 which is joined with the power rail 40. The power rail 20 is configured to receive a first supply voltage (e.g., the upper voltage VDDL) for the lower voltage domain. The power rail 40 is configured to have a second supply voltage (e.g., the lower voltage VSSL) for the lower voltage domain. The connection node 62 is configured to receive an alternative supply voltage VSSA for the lower voltage domain. In some embodiments, the voltage difference between the alternative supply voltage VSSA (e.g., 0.45V) and the lower voltage VSSL (e.g., 0.0V) is smaller than the voltage difference between the upper voltage VDDL (e.g., 0.75V) and the lower voltage VSSL (e.g., 0.0V) in the lower voltage domain.

Figure 1B:
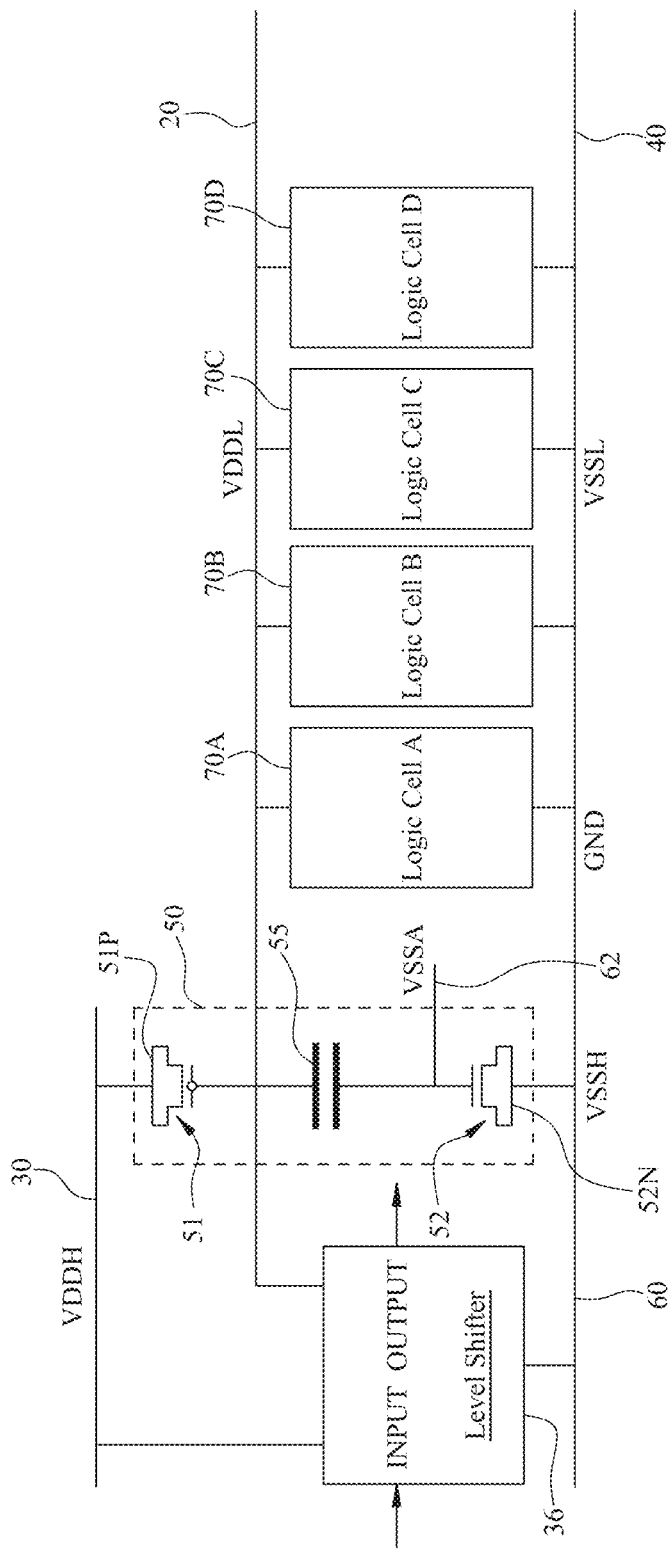
Figure 1C:
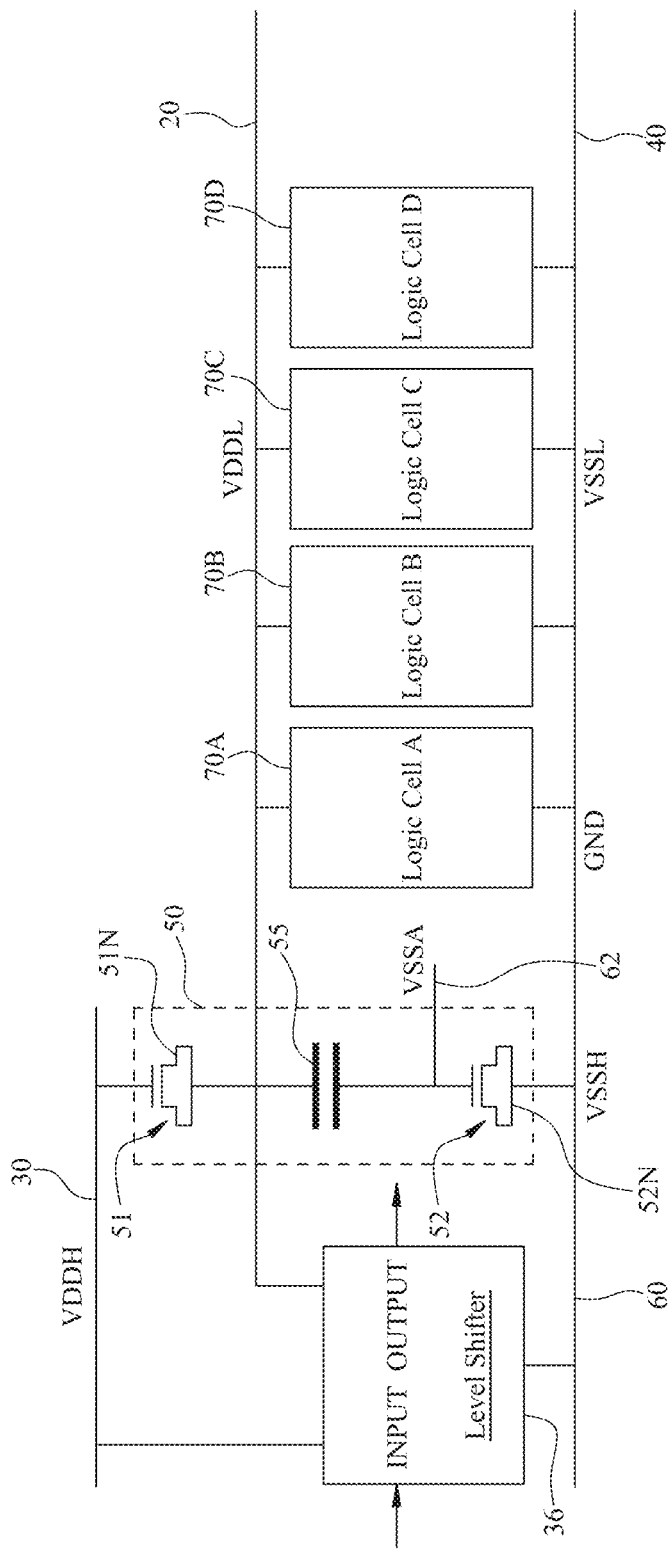
Figure 1D:
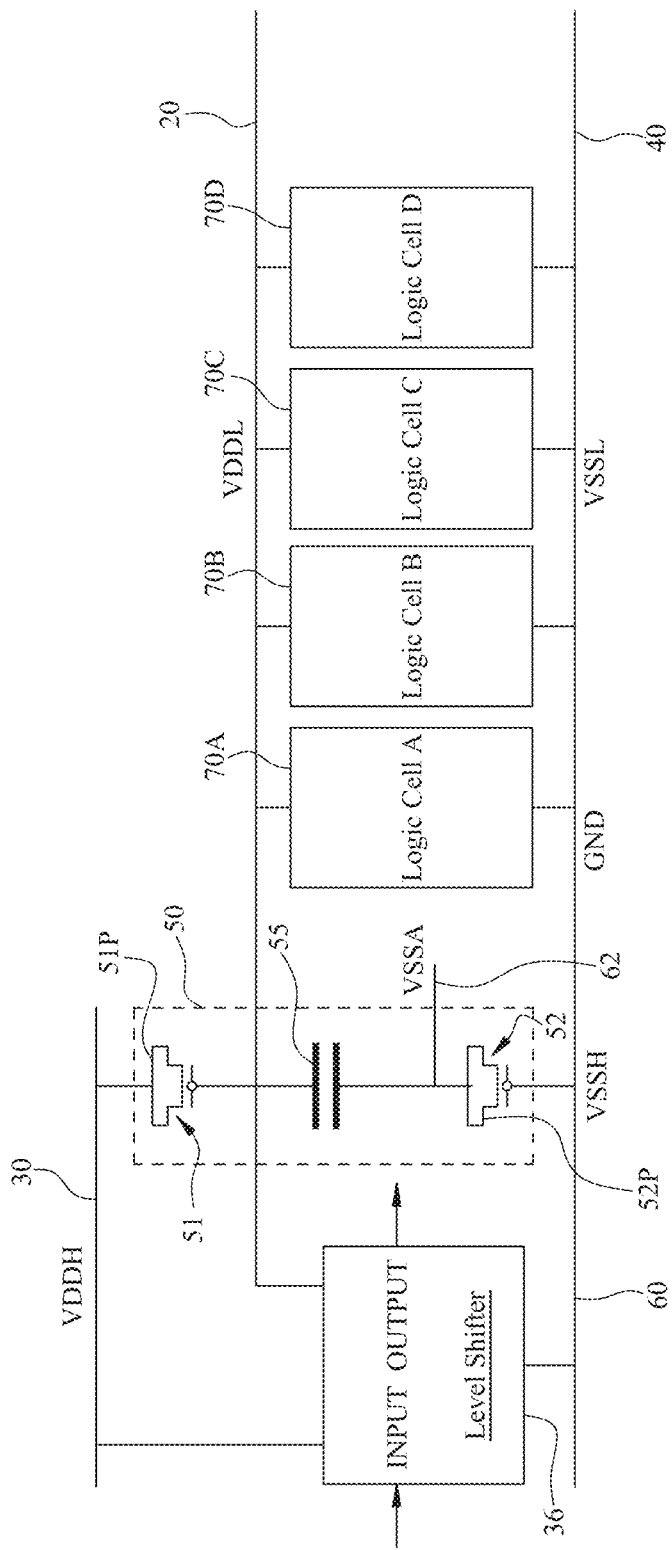

In the decoupling capacitor circuit 50 of FIGS. 1B-1D, the first metal-insulator-semiconductor capacitor 51 and the second metal-insulator-semiconductor capacitor 52 are implemented with MOS transistors. In some embodiments, both the voltage difference VDDH-VDDL and the voltage difference VSSA-VSSH are smaller than the voltage difference VDDL-VSSL between the upper voltage VDDL and the lower voltage VSSL in the lower voltage domain, and the transistors for operating in the lower voltage domain are used for implementing the first metal-insulator-semiconductor capacitor 51 and the second metal-insulator-semiconductor capacitor 52. As a comparison, in some alternative designs that are different from the decoupling capacitor circuit 50 in the present disclosure, the transistors for operating in the higher voltage domain are used for implementation of a decoupling capacitor circuit for filtering the noise on the power nodes (such as power nodes 30 and 60) in the higher voltage domain. For example, in some alternative designs for filtering the noise, a MOS capacitor formed by a transistor designed for operating in the higher voltage domain is connected between the power node 30 of the upper voltage VDDH and the power node 60 of the lower voltage VSSH.

In the decoupling capacitor circuit 50 of FIGS. 1B-1D, the MOS transistors for implementing the first metal-insulator-semiconductor capacitor 51 and the second metal-insulator-semiconductor capacitor 52 are transistors designed for operating in the low voltage domain. In FIG. 1B, the first metal-insulator-semiconductor capacitor 51 is implemented with a PMOS transistor 51P, and the second metal-insulator-semiconductor capacitor 52 is implemented with an NMOS transistor 52N. The source terminal and the drain terminal of the PMOS transistor 51P are conductively connected to the power node 30, while the gate of the PMOS transistor 51P is conductively connected to the first terminal of the metal-insulator-metal capacitor 55. Additionally, the gate of the NMOS transistor 52N is conductively connected to the second terminal of the metal-insulator-metal capacitor 55, while the source terminal and the drain terminal of the NMOS transistor 52N are conductively connected to the power node 60.

In FIG. 1C, the first metal-insulator-semiconductor capacitor 51 is implemented with a first NMOS transistor 51N, and the second metal-insulator-semiconductor capacitor 52 is implemented with a second NMOS transistor 52N. The gate of the NMOS transistor 51N is conductively connected to the power node 30, while the source terminal and the drain terminal of the NMOS transistor 52N are conductively connected to the first terminal of the metal-insulator-metal capacitor 55. Additionally, the gate of the NMOS transistor 52N is conductively connected to the second terminal of the metal-insulator-metal capacitor 55, while the source terminal and the drain terminal of the NMOS transistor 52N are conductively connected to the power node 60.

In FIG. 1D, the first metal-insulator-semiconductor capacitor 51 is implemented with a first PMOS transistor 51P, and the second metal-insulator-semiconductor capacitor 52 is implemented with a second PMOS transistor 52P. The source terminal and the drain terminal of the PMOS transistor 51P are conductively connected to the power node 30, while the gate of the PMOS transistor 51P is conductively connected to the first terminal of the metal-insulator-metal capacitor 55. Additionally, the source terminal and the drain terminal of the PMOS transistor 52P are conductively connected to the second terminal of the metal-insulator-metal capacitor 55, while the gate of the PMOS transistor 52P is conductively connected to the power node 60.

In FIGS. 1A-1D, the decoupling capacitor circuit 50 has the function of filtering noise on various power supply lines. CMOS circuits are often synchronized by a clock. The CMOS circuits draw current from power supply lines (such as the power rails 20 and 40, or the power nodes 30 and 60) when the clock makes a transition. During the operation of the CMOS circuits, the transient currents associated with the clock transition generate noise on the power supply lines in the form of voltage and/or current fluctuation. In FIGS. 1A-1D, the decoupling capacitor circuit 50 filters the noise between the power nodes 30 and 60 and the noise between the power rails 20 and 40. The decoupling capacitor circuit 50 also filters the noise between the connection node 62 and the power rail 40. When the power node 60 and the power rail 40 are maintained at the ground voltage GND, the voltage fluctuation on each of the power node 30, the power rail 20, and the connection node 62 are reduced by the decoupling capacitor circuit 50.

FIGS. 2A-2C and FIGS. 2Aa-2Ca are circuit diagrams of various equivalent circuits of the decoupling capacitor circuit 50 when noises are coupled to the decoupling capacitor circuit from the power supply lines, in accordance with some embodiments. In FIGS. 2A-2C, the first metal-insulator-semiconductor capacitor 51 has a capacitance value C1, the metal-insulator-metal capacitor 55 has a capacitance value C2, and the second metal-insulator-semiconductor capacitor 52 has a capacitance value C3. The first metal-insulator-semiconductor capacitor 51, the metal-insulator-metal capacitor 55, and the second metal-insulator-semiconductor capacitor 52 are connected in series between the power node 30 and the ground GND. The first terminal of the metal-insulator-metal capacitor 55 is connected to the power rail 20, while the second terminal of the metal-insulator-metal capacitor 55 is connected to the connection node 62.

In FIG. 2A, for analyzing the AC effect on the upper voltage VDDH at the power node 30 by the decoupling capacitor circuit 50, the power rail 20 and the connection node 62 are maintained at the AC ground AC_GND for the AC signal received from the power node 30. FIG. 2Aa depicts a circuit that is equivalent to the circuit in FIG. 2A when all nodes maintained at AC_GND or GND are connected together as one single node which is maintained at the AC ground AC_GND. As shown in FIG. 2Aa, the upper voltage VDDH at the power node 30 is filtered with a filtering capacitor having the capacitance value C1.

In FIG. 2B, for analyzing the AC effect on the upper voltage VDDL at the power rail 20 by the decoupling capacitor circuit 50, the power node 30 and the connection node 62 are maintained at the AC ground AC_GND for the AC signal received from the power rail 20. FIG. 2Ba depicts a circuit that is equivalent to the circuit in FIG. 2B when all nodes maintained at AC_GND or GND are connected together as one single node which is maintained at the AC ground AC_GND. As shown in FIG. 2Ba, the upper voltage VDDL at the power rail 20 is filtered with a filtering capacitor having the capacitance value C1+C2.

In FIG. 2C, for analyzing the AC effect on the alternative supply voltage VSSA at the connection node 62 by the decoupling capacitor circuit 50, the power node 30 and the power rail 20 are maintained at the AC ground AC_GND for the AC signal received from the connection node 62. FIG. 2Ca depicts a circuit that is equivalent to the circuit in FIG. 2C when all nodes maintained at AC_GND or GND are connected together as one single node which is maintained at the AC ground AC_GND. As shown in FIG. 2Ca, the alternative supply voltage VSSA at the connection node 62 is filtered with a filtering capacitor having the capacitance value C2+C3.

In FIGS. 1A-1D, the power rails 20 and 40 form a pair of power rails for powering the logic cells in the lower voltage domain. In some embodiments, as shown in FIGS. 3A-3D, a power rail 24 is conductively connected to the power node 30, and a power rail 64 is conductively connected to the connection node 62. The power rails 24 and 64 form a pair of power rails for powering the logic cells 70E-70F in the lower voltage domain. The circuits in FIGS. 3A-3D are correspondingly modified from the circuits in FIGS. 1A-1D. The modification includes adding the power rails 24 and 64 to the circuits in FIGS. 1A-1D and connecting the logic cells 70E-70F between the power rail 24 and the power rail 64. The power rail 24 is maintained at the upper voltage VDDH, and the power rail 64 is maintained at the alternative supply voltage VSSA. In both the circuit in FIG. 1B and the circuit in FIG. 3B, the first metal-insulator-semiconductor capacitor 51 and the second metal-insulator-semiconductor capacitor 52 are correspondingly implemented with the PMOS transistor 51P and the NMOS transistor 52N. In both the circuit in FIG. 1C and the circuit in FIG. 3C, the first metal-insulator-semiconductor capacitor 51 and the second metal-insulator-semiconductor capacitor 52 are correspondingly implemented with the NMOS transistor 51N and the NMOS transistor 52N. In both the circuit in FIG. 1D and the circuit in FIG. 3D, the first metal-insulator-semiconductor capacitor 51 and the second metal-insulator-semiconductor capacitor 52 are correspondingly implemented with the PMOS transistor 51P and the PMOS transistor 52P.

In some embodiments, the voltage difference VDDH-VSSA in the power rail pair formed with the power rails 24 and 64 is the same as the voltage difference VDDL. VSSL in the power rail pair formed with the power rails 20 and 40. As a non-limiting example, in some embodiments. VDDH is 1.2 V, VDDL is 0.75 V. VSSA is 0.45V, and VSSL is maintained at 0.0V. In the non-limiting example, the voltage difference VDDL-VSSL is 0.75V. and the voltage difference VDDH-VSSA is also 0.75V. In some embodiments, however, the voltage difference VDDH-VSSA is different from the voltage difference VDDL-VSSL.

In FIGS. 1A-1D and FIGS. 3A-3D, the decoupling capacitor circuit 50 reduces both the fluctuation of the voltage difference VDDH-VSSH in the higher voltage domain and the fluctuation of the voltage difference VDDL-VSSL in the lower voltage domain. In FIGS. 3A-3D, the decoupling capacitor circuit 50 also reduces the fluctuation of the voltage difference VDDH-VSSA applied to the logic cells 70E-70F in the lower voltage domain. Despite the decoupling capacitor circuit 50 being implemented with the transistors designed for the lower voltage domain, the decoupling capacitor circuit 50 is still able to provide the filtering function on the voltage difference VDDH-VSSH in the higher voltage domain while the MOS transistors in the decoupling capacitor circuit 50 are subjected to reduced voltage stress, even though the voltage difference VDDH-VSSH in the higher voltage domain is larger than the voltage difference VDDL-VSSL in the lower voltage domain. Each MOS capacitor in the decoupling capacitor circuit 50 has reduced voltage stress (as compared with a MOS capacitor directly connected between the power nodes 30 and 60), because the voltage applied between the two electrodes of each MOS capacitor in the decoupling capacitor circuit 50 is smaller than the voltage difference VDDH-VSSH in the higher voltage domain.

In FIGS. 1A-1D and FIGS. 3A-3D, while the metal-insulator-metal capacitor 55 is represented by one capacitor symbol as a single circuit element, the metal-insulator-metal capacitor 55 fabricated in an integrated circuit generally includes one or more physical capacitive devices connected in parallel. In some embodiments, all of the physical capacitive devices for forming the metal-insulator-metal capacitor 55 are metal-insulator-metal ("MIM") capacitive devices. In some embodiments, some of the physical capacitive devices for forming the metal-insulator-metal capacitor 55 are MIM capacitive devices. The metal-insulator-metal capacitor 55 fabricated in an integrated circuit generally includes at least one MIM capacitive device.

Figure 4A:
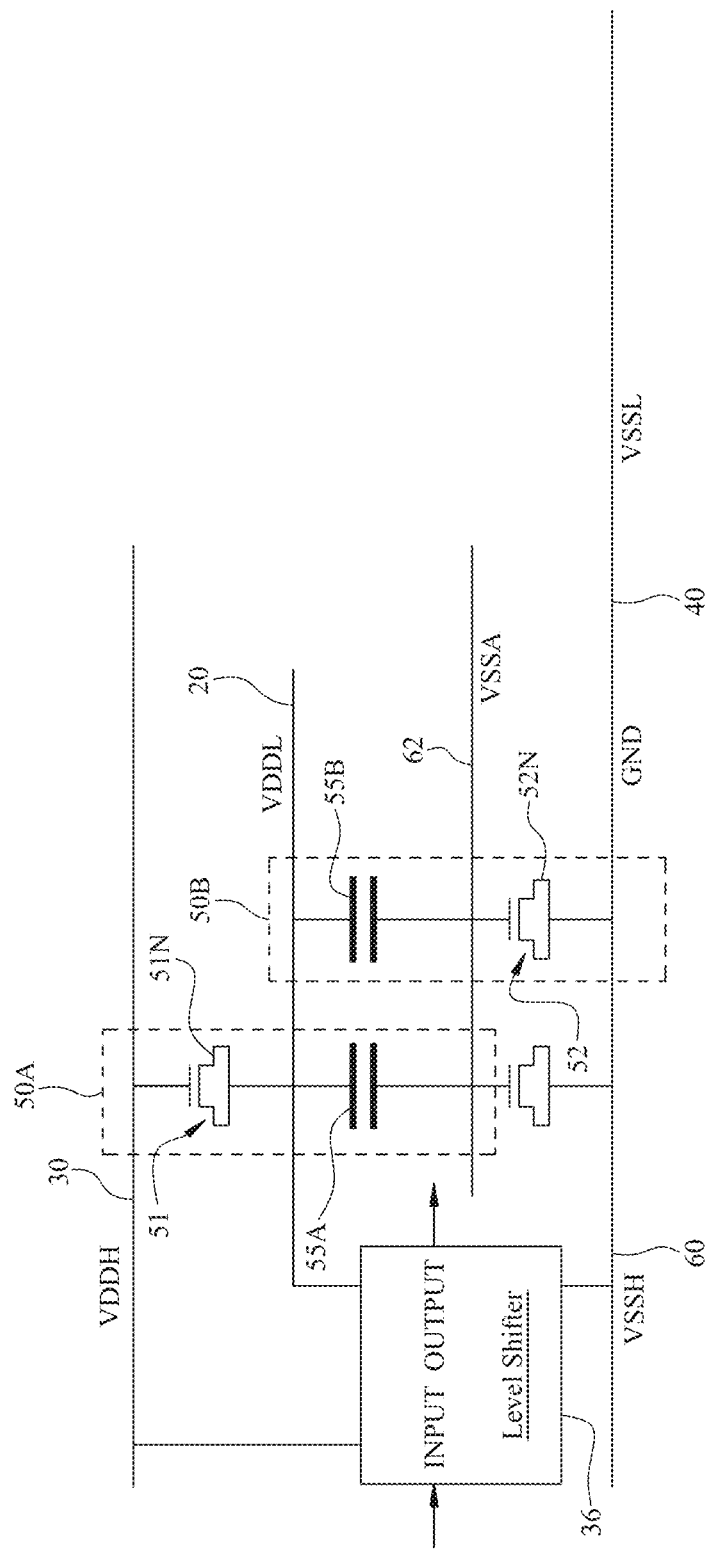
FIG. 4A is a circuit diagram of a decoupling capacitor circuit having two capacitive sub-circuits, in accordance with some embodiments.

FIG. 4A is a circuit diagram of a decoupling capacitor circuit having two capacitive sub-circuits, in accordance with some embodiments. The capacitive sub-circuit 50A is conductively connected between the power node 30 and the connection node 62. The capacitive sub-circuit 50B is conductively connected between the power rail 20 and the power node 60. The first metal-insulator-semiconductor capacitor 51 in the capacitive sub-circuit 50A is implemented with a first NMOS transistor 51N. The second metal-insulator-semiconductor capacitor 52 in the capacitive sub-circuit 50B is implemented with a second NMOS transistor 52N. The MIM capacitor 55A in the capacitive sub-circuit 50A is connected in parallel with the MIM capacitor 55B in the capacitive sub-circuit 50B. If the capacitive sub-circuits 50A and 50B are represented as an equivalent circuit in the form of the decoupling capacitor circuit 50 in FIG. 1C, then the metal-insulator-metal capacitor 55 includes the MIM capacitor 55A and the MIM capacitor 55B connected in parallel together. In some embodiments, the MIM capacitor 55A and the MIM capacitor 55B are fabricated at different areas in a circuit cell.

FIGS. 4B-4C are layout diagrams of the capacitive sub-circuits in FIG. 4A, in accordance with some embodiments. In the layout diagram for the capacitive sub-circuit 50A as shown in FIG. 4B, the NMOS transistor 51N in the capacitive sub-circuit 50A is fabricated at a first part of the active-region structure 80n. In FIG. 4B, the gate-conductor 453A intersects the first part of the active-region structure 80n at a channel region of the NMOS transistor 51N. Each of the terminal-conductors 432A and 434A intersects the active-region structure 80n at one of the source region and the drain region of the NMOS transistor 51N. The horizontal conducting lines 422A, 424A, and 426A extend in the X-direction are fabricated in a first metal layer (such as metal layer M0). The horizontal conducting line 424A is conductively connected to each of the terminal-conductors 432A and 434A through a corresponding via-connector VD. The gate-conductor 453A is configured to receive the upper voltage VDDH for the higher voltage domain. The horizontal conducting line 424A is configured to receive the upper voltage VDDL for the lower voltage domain. The horizontal conducting lines 422A and 426A are configured to receive the alternative supply voltage VSSA for the lower voltage domain.

FIG. 4D is a cross-sectional view of the capacitive sub-circuit 50A as specified by the layout diagrams in FIG. 4B in a cutting plane A-A', in accordance with some embodiments. The terminal-conductor 434A extends in the Y-direction and intersects the active-region structure 80n. The horizontal conducting lines 422A, 424A, and 426A are fabricated in the first metal layer on the interlayer dielectric covering the terminal-conductor 434A and the active-region structure 80n. The horizontal conducting line 424A is conductively connected to the terminal-conductor 434A through the via-connector VD.

The circuit elements in the capacitive sub-circuit 50A as specified by the layout diagrams in FIG. 4B include NMOS transistor 51N and various capacitors that form the MIM capacitor 55A in FIG. 4A. As shown in FIG. 4B, the capacitance between the gate-conductor 453A and the terminal-conductor 434A is cT1a, while the capacitance between the gate-conductor 453A and the terminal-conductor 432A is cT1b. The capacitance between the horizontal conducting line 424A and the horizontal conducting line 422A is cT2, while the capacitance between the horizontal conducting line 424A and the horizontal conducting line 426A is cT3. The capacitance between the horizontal conducting line 422A and the terminal-conductor 434A is cT4a, while the capacitance between the horizontal conducting line 422A and the terminal-conductor 432A is cT4b. The capacitance between the horizontal conducting line 426A and the terminal-conductor 434A is cT5a, while the capacitance between the horizontal conducting line 426A and the terminal-conductor 432A is cT5b. The capacitance between the gate-conductor 453A and the horizontal conducting line 422A is cT6, while the capacitance between the gate-conductor 453A and the horizontal conducting line 424A is cT7.

In the layout diagram for the capacitive sub-circuit 50B as shown in FIG. 4C, the NMOS transistor 52N in the capacitive sub-circuit 50B is fabricated at a second part of the active-region structure 80n. In FIG. 4C, the gate-conductor 457B intersects the second part of the active-region structure 80n at a channel region of the NMOS transistor 52N. Each of the terminal-conductors 436B and 438B intersects the active-region structure 80n at one of the source region and the drain region of the NMOS transistor 52N. The horizontal conducting lines 422B, 424B, 426B, and 428B extending in the X-direction are fabricated in the first metal layer (such as metal layer M0). The gate-conductor 457B is conductively connected to each of the horizontal conducting lines 424B and 428B through a corresponding via-connector VG. The gate-conductor 457B is configured to receive the alternative supply voltage VSSA for the lower voltage domain. The terminal-conductors 436B and 438B are connected to the ground voltage GND. The horizontal conducting lines 422B and 426B are configured to receive the upper voltage VDDL for the lower voltage domain. The horizontal conducting lines 424B and 428B are configured to receive the alternative supply voltage VSSA for the lower voltage domain.

FIG. 4E is a cross-sectional view of the capacitive sub-circuit 50B as specified by the layout diagrams in FIG. 4C in a cutting plane B-B', in accordance with some embodiments. The gate-conductor 457B extends in the Y-direction and intersects the active-region structure 80n. The horizontal conducting lines 422B, 424B, 426B, and 428B are fabricated in the first metal layer on the interlayer dielectric covering the gate-conductor 457B and the active-region structure 80n. Each of the horizontal conducting lines 424B and 428B is conductively connected to the gate-conductor 457B through a corresponding via-connector VG.

The circuit elements in the capacitive sub-circuit 50B as specified by the layout diagrams in FIG. 4C include the NMOS transistor 52N and various capacitors that form the MIM capacitor 55B in FIG. 4A. As shown in FIG. 4C, the capacitance value between the gate-conductor 457B and the terminal-conductor 438B is cB1a, while the capacitance value between the gate-conductor 457B and the terminal-conductor 436B is cB1b. The capacitance value between the horizontal conducting line 424B and the horizontal conducting line 422B is cB2. The capacitance value between the horizontal conducting line 426B and the horizontal conducting line 424B is cB3a, while the capacitance value between the horizontal conducting line 426B and the horizontal conducting line 428B is cB3b. The capacitance value between the horizontal conducting line 422B and the terminal-conductor 438B is cB4a, while the capacitance value between the horizontal conducting line 422B and the terminal-conductor 436B is cB4b. The capacitance value between the horizontal conducting line 426B and the terminal-conductor 438B is cB5a, while the capacitance value between the horizontal conducting line 426B and the terminal-conductor 436B is cB5b. The capacitance value between the gate-conductor 457B and the horizontal conducting line 422B is cB6, while the capacitance value between the gate-conductor 457B and the horizontal conducting line 426B is cB7.

FIG. 4F is an equivalent circuit of the capacitive sub-circuits 50A and 50B as specified by the layout diagrams in FIG. 4D and FIG. 4E while the capacitive sub-circuits 50A and 50B are connected together as shown in FIG. 4A, in accordance with some embodiments. In FIG. 4F, the gate of the NMOS transistor 51N is connected to the upper voltage VDDH for the higher voltage domain, while the source and drain of the NMOS transistor 51N are connected to the upper voltage VDDL for the lower voltage domain. The gate of the NMOS transistor 52N is connected to the alternative supply voltage VSSA for the lower voltage domain, while the source and drain of the NMOS transistor 51N are connected to the ground voltage GND. The metal-insulator-metal capacitor 55 connected between the upper voltage VDDL and the alternative supply voltage VSSA includes equivalent MIM capacitors Ca2, Cm, and Ca3. The equivalent MIM capacitor Cm includes capacitors cT2, cT3, cB2, cB3a, and cB3b in FIGS. 4B-4C connected in parallel. The equivalent MIM capacitor Ca2 includes capacitors cT4a, cT4b, cT5a, and cT5b in FIG. 4B connected in parallel. The equivalent MIM capacitor Ca3 includes capacitors cB6 and cB7 in FIG. 4C connected in parallel.

Additionally, in FIG. 4F, the equivalent MIM capacitor Ca1 is connected between the upper voltage VDDH for the higher voltage domain and the alternative supply voltage VSSA for the lower voltage domain. The equivalent MIM capacitor Ca4 is connected between the upper voltage VDDH for the lower voltage domain and the ground voltage GND. The equivalent MIM capacitor Ca1 includes parallel-connected capacitors cT6 and cT7 in FIG. 4B parallel-connected together. The equivalent MIM capacitor Ca4 includes parallel-connected capacitors cB4a, cB4b, cB5a, and cB5b in FIG. 4C.

In FIGS. 4B-4C, many MIM capacitors are formed between horizontal conducting lines in the first metal layer above the NMOS transistors 51N and 52N and formed between the horizontal conducting lines and the gate-conductors/terminal conductors. Consequently, the various MIM capacitors for forming the metal-insulator-metal capacitor 55 are effectively stacked with the metal-insulator-semiconductor capacitor 51 formed by the NMOS transistor 51N (in FIG. 4B) and stacked with the metal-insulator-semiconductor capacitor 52 formed by the NMOS transistor 52N (in FIG. 4B). The stacking of the various MIM capacitors with the NMOS transistors 51N and 52N saves the needed layout area in an integrated circuit for implementing the decoupling capacitor circuit 50. Furthermore, in some embodiments, additional MIM capacitors for forming the metal-insulator-metal capacitor 55 are implemented with conducting lines in one or more metal layers (such as in metal layers M1 and/or M2) above the first metal layer, whereby the capacitance value of the metal-insulator-metal capacitor 55 is increased while at the same time limiting the amount of increase in the needed layout area for implementing the decoupling capacitor circuit 50.

While the decoupling capacitor circuit 50 in FIG. 4A is implemented with NMOS transistors as specified by the layout diagrams of FIGS. 4B-4C, a decoupling capacitor circuit that is implemented with PMOS transistors based on alternative layout designs (which is modified from the layout diagrams of FIGS. 4B-4C) is also within the contemplated scope of the present disclosure. Furthermore, in the embodiments as shown in FIGS. 4A-4C, the metal-insulator-semiconductor capacitor 51 and metal-insulator-semiconductor capacitor 52 are both formed with same type of transistors (which are both NMOS transistors). In some alternative embodiments, the metal-insulator-semiconductor capacitor 51 is formed with a first-type transistor (e.g., a PMOS transistor), but the metal-insulator-semiconductor capacitor 52 is formed with a second-type transistor (e.g., an NMOS transistor).

Figure 3A:
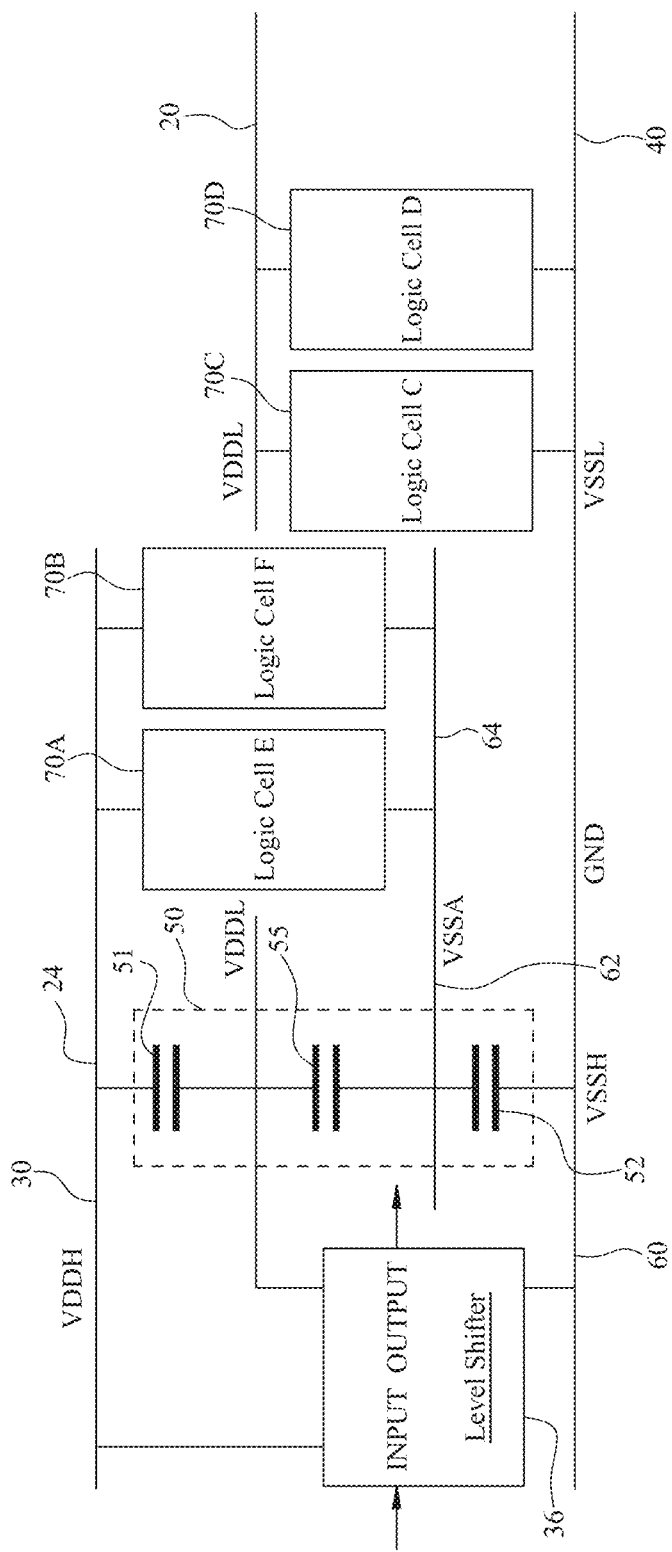
FIGS. 3A-3D are circuit diagrams of decoupling capacitor circuits, in accordance with some embodiments.
Figure 3B:
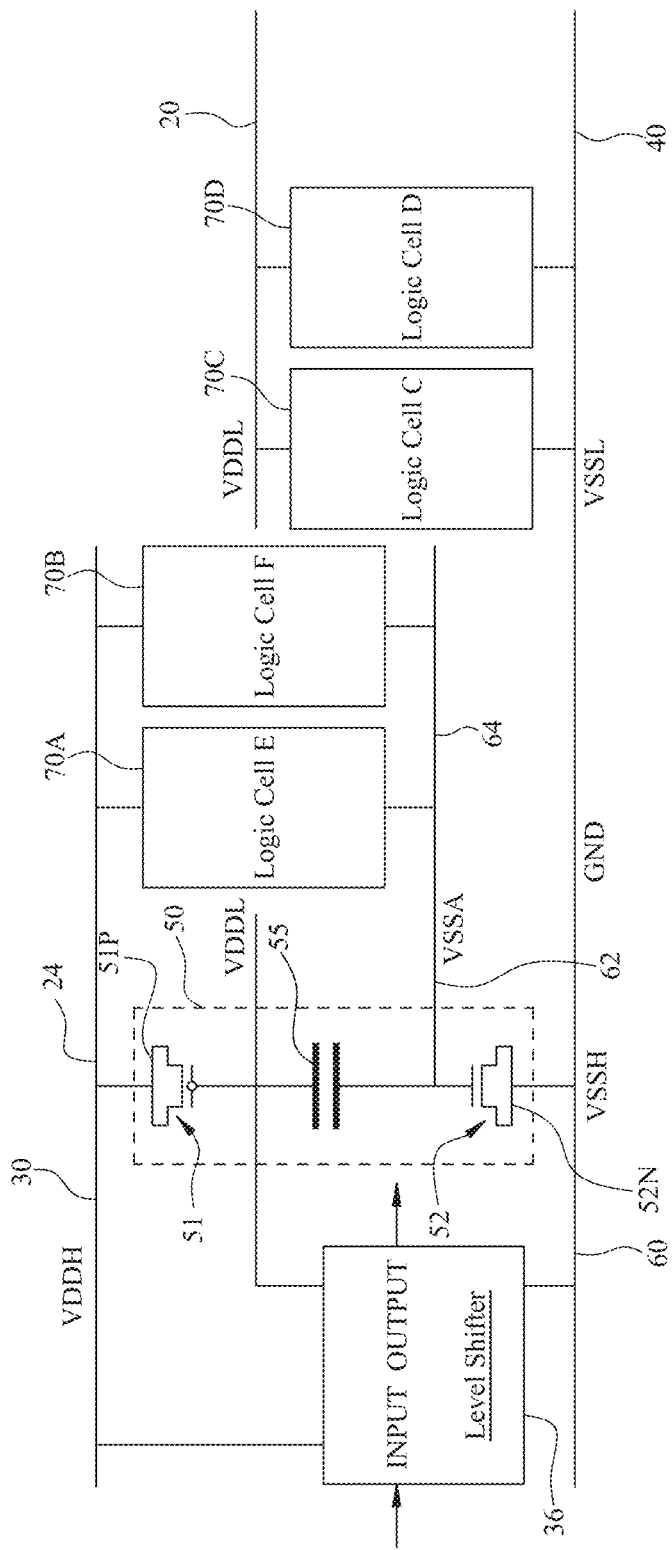
Figure 3C:
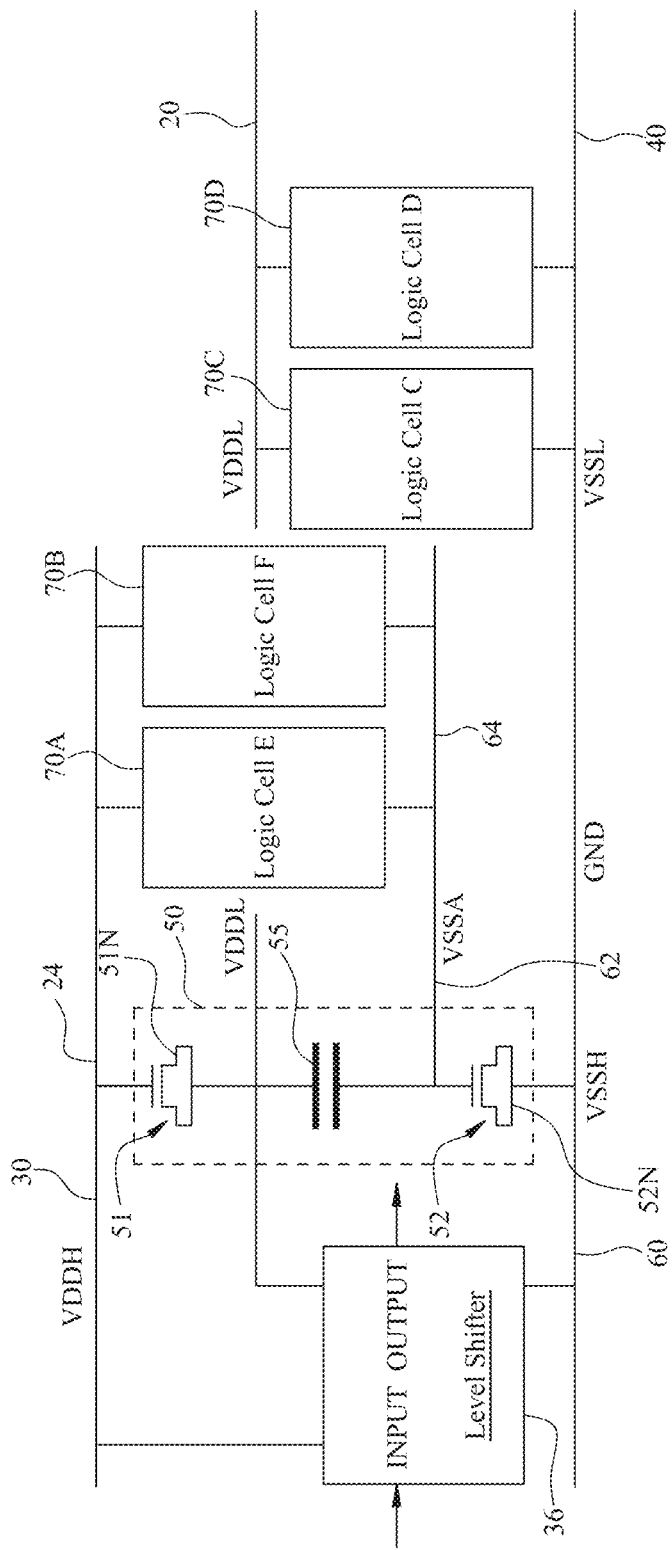
Figure 3D:
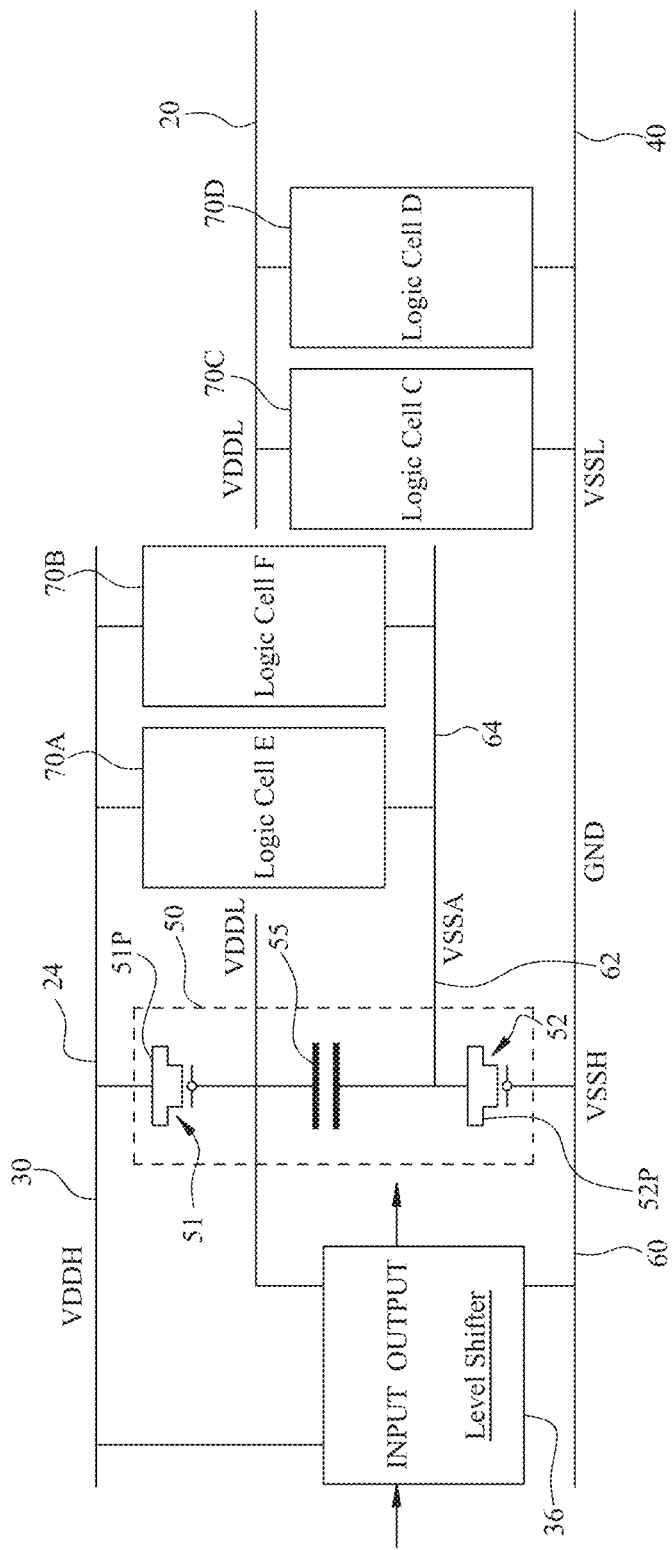
Figure 5A:
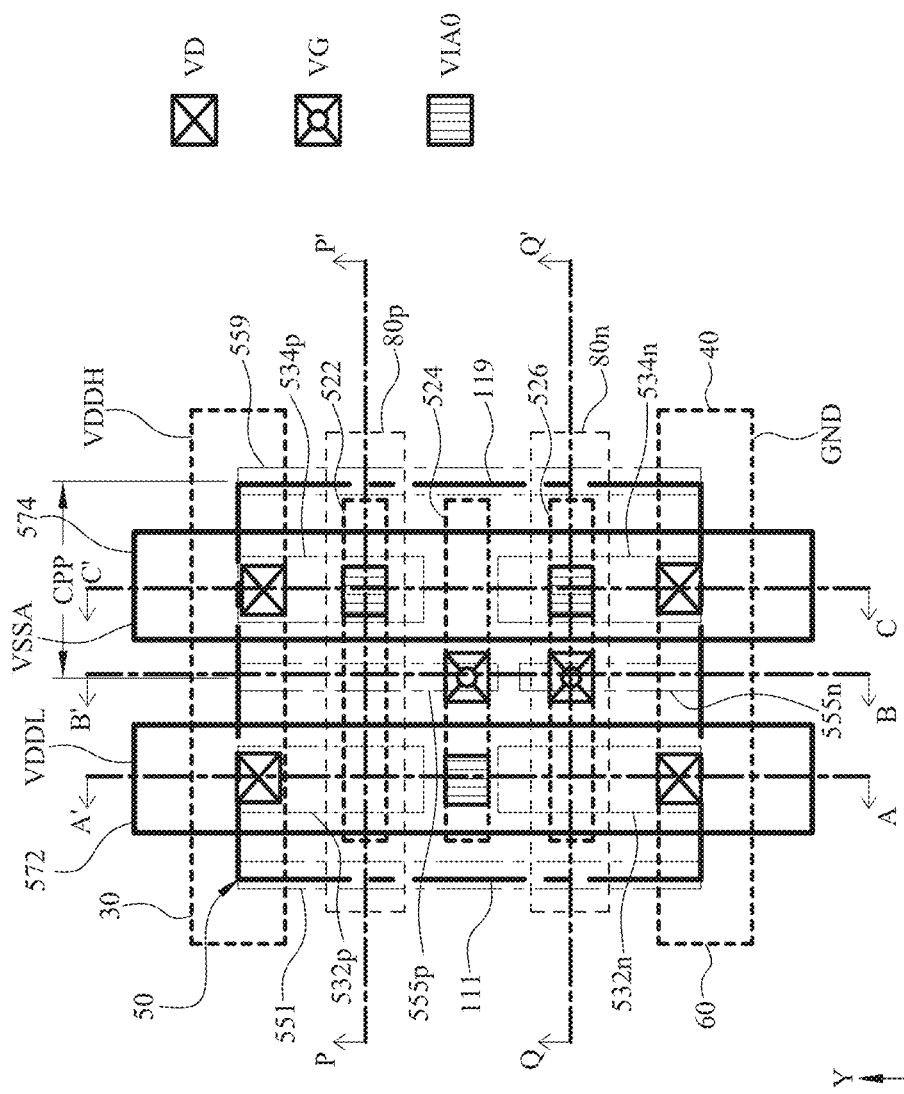
FIG. 5A is a layout diagram of the decoupling capacitor circuit, in accordance with some embodiments.

FIG. 5A is a layout diagram of the decoupling capacitor circuit 50 in FIG. 1B or 3B, in accordance with some embodiments. In FIG. 5A, the gate-conductor 555p intersects the active-region structure 80p at a channel region of the PMOS transistor 51P. Each of the terminal-conductors 532p and 534p intersects the active-region structure 80p at one of the source region and the drain region of the PMOS transistor 51P. The gate-conductor 555n intersects the active-region structure 80n at a channel region of the NMOS transistor 52N. Each of the terminal-conductors 532n and 534n intersects the active-region structure 80n at one of the source region and the drain region of the NMOS transistor 52N.

The decoupling capacitor circuit 50 as specified by the layout diagram in FIG. 5A is in a circuit cell that is bounded by cell boundaries, and the cell width along the X-direction is bounded by two vertical cell boundaries 111 and 119 extending in the Y-direction. In FIG. 5A, the layout patterns for the dummy gate-conductors 551 and 559 at the vertical cell boundaries 111 and 119 specify that each of the active-region structures 80p and 80n does not extend into adjacent cells. That is, none of the source regions, drain regions, and channel regions in the active-region structure 80p or in the active-region structure 80n joins with other active regions (such as, source regions, drain regions, and channel regions) in the adjacent cells. Each of the dummy gate-conductors 551 and 559 is separated from the gate-conductors 555p and 555n along the X-direction by a pitch distance of one contacted poly pitch ("CPP").

The horizontal conducting lines 522, 524, and 526 extending in the X-direction are fabricated in a first metal layer (such as metal layer M0). The horizontal conducting line 522 is conductively connected to the gate-conductor 555p through a corresponding via-connector VG. The horizontal conducting line 524 is conductively connected to the gate-conductor 555p through a corresponding via-connector VG. The horizontal conducting line 526 is conductively connected to the gate-conductor 555n through a corresponding via-connector VG. The power rail of the power node 30 and the power rail 40 extending in the X-direction are also fabricated in the first metal layer (such as metal layer M0). Each of the terminal-conductors 532p and 534p is connected to the power rail of the power node 30 through a corresponding via-connector VD. Each of the terminal-conductors 532n and 534n is connected to the power rail 40 through a corresponding via-connector VD.

The vertical conducting lines 572 and 574 extending in the Y-direction are fabricated in a second metal layer (such as metal layer M1) above the first metal layer. The vertical conducting line 572 is conductively connected to the horizontal conducting line 524 through a corresponding via-connector VIA0. The vertical conducting line 574 is conductively connected to each of the horizontal conducting lines 522 and 526 through a corresponding via-connector VIA0.

FIGS. 5B1-5B3 are cross-sectional views of the decoupling capacitor circuit 50 as specified by the layout diagrams in FIG. 5A in various cutting planes, in accordance with some embodiments. In FIG. 5B1, which is the cross-sectional view along the cutting plane A-A', the terminal-conductor 532p extends in the Y-direction and intersects the active-region structure 80p at a source/drain region of the PMOS transistor 51P, while the terminal-conductor 532n extends in the Y-direction and intersects the active-region structure 80n at a source/drain region of the NMOS transistor 52N. In FIG. 5B2, which is the cross-sectional view along the cutting plane B-B', the gate-conductor 555p extends in the Y-direction and intersects the active-region structure 80p at the channel region of the PMOS transistor 51P, while the gate-conductor 555n extends in the Y-direction and intersects the active-region structure 80n at the channel region of the NMOS transistor 52N. In FIG. 5B3, which is the cross-sectional view along the cutting plane C-C', the terminal-conductor 534p extends in the Y-direction and intersects the active-region structure 80p at a source/drain region of the PMOS transistor 51P, while the terminal-conductor 534n extends in the Y-direction and intersects the active-region structure 80n at a source/drain region of the NMOS transistor 52N.

In FIGS. 5B1-5B3, the horizontal conducting lines 522, 525, and 526 extending in the X-direction are fabricated in the first metal layer on the interlayer dielectric covering the active-region structures 80p and 80n and covering the terminal-conductors 532p, 532n, 534p, and 534n. The power rail of the power node 30 and the power rail 40 extending in the X-direction are also fabricated in the first metal layer. The vertical conducting lines 572 and 574 extending in the Y-direction are fabricated in the second metal layer on the interlayer dielectric covering the horizontal conducting lines 522, 525, and 526 and covering the power rail of the power node 30 and the power rail 40.

In FIGS. 5B1, the horizontal conducting line 526 is conductively connected to the terminal-conductor 532n through a corresponding via-connector VD. The power rail of the power node 30 is conductively connected to the terminal-conductor 532p through a corresponding via-connector VD near the power node 30. The power rail 40 is conductively connected to the terminal-conductor 532n through a corresponding via-connector VD near the power rail 40. The vertical conducting line 572 is conductively connected to the horizontal conducting line 524 through a corresponding via-connector VIA0.

In FIGS. 5B2, the horizontal conducting line 524 is conductively connected to the gate-conductor 555p through a corresponding via-connector VG, while the horizontal conducting line 526 is conductively connected to the gate-conductor 555n through another corresponding via-connector VG.

In FIGS. 5B3, the horizontal conducting line 526 is conductively connected to the terminal-conductor 534n through a corresponding via-connector VD. The power rail of the power node 30 is conductively connected to the terminal-conductor 534p through a corresponding via-connector VD near the power node 30. The power rail 40 is conductively connected to the terminal-conductor 534n through a corresponding via-connector VD near the power rail 40. The vertical conducting line 574 is conductively connected to each of the horizontal conducting lines 522 and 526 through a corresponding via-connector VIA0.

FIG. 5C1 is a cross-sectional view of the decoupling capacitor circuit 50 as specified by the layout diagrams in FIG. 5A in the cutting plane P-P', in accordance with some embodiments. In FIO. 5C1, the gate-conductor 555p intersects the active-region structure 80p at a channel region of the PMOS transistor 51P. Each of the terminal-conductors 532p and 534p intersects the active-region structure 80p at one of the source region and the drain region of the PMOS transistor SIP. The active regions (such as, the source region, the channel region, or the drain region) in the active-region structure 80p are isolated from the active regions in the adjacent cells, by the boundary isolation region 551i under the dummy gate-conductor 551 and the boundary isolation region 559i under the dummy gate-conductor 559. The horizontal conducting line 522 extending in the X-direction is fabricated in the first metal layer on the interlayer dielectric covering the active-region structure 80p, the terminal-conductors 532p and 534p, and the dummy gate-conductors 551 and 559. The vertical conducting lines 572 and 574 extending in the Y-direction are fabricated in the second metal layer on the interlayer dielectric covering the horizontal conducting line 522. The vertical conducting line 574 is conductively connected to the horizontal conducting line 522 through the via-connector VIA0.

FIG. 5C2 is a cross-sectional view of the decoupling capacitor circuit 50 as specified by the layout diagrams in FIG. 5A in the cutting plane Q-Q', in accordance with some embodiments. In FIG. 5C2, the gate-conductor 555n intersects the active-region structure 80n at a channel region of the NMOS transistor 52N. Each of the terminal-conductors 532n and 534n intersects the active-region structure 80n at one of the source region and the drain region of the NMOS transistor 52N. The active regions (such as, the source region, the channel region, or the drain region) in the active-region structure 80n are isolated from the active regions in the adjacent cells, by the boundary isolation region 551i under the dummy gate-conductor 551 and the boundary isolation region 559i under the dummy gate-conductor 559. The horizontal conducting line 526 extending in the X-direction is fabricated in the first metal layer on the interlayer dielectric covering the active-region structure 80n, the terminal-conductors 532n and 534n, and the dummy gate-conductors 551 and 559. The vertical conducting lines 572 and 574 extending in the Y-direction are fabricated in the second metal layer on the interlayer dielectric covering the horizontal conducting line 526. The vertical conducting line 574 is conductively connected to each of the horizontal conducting line 526 through the via-connector VIA0.

Figures 5D, 5E:
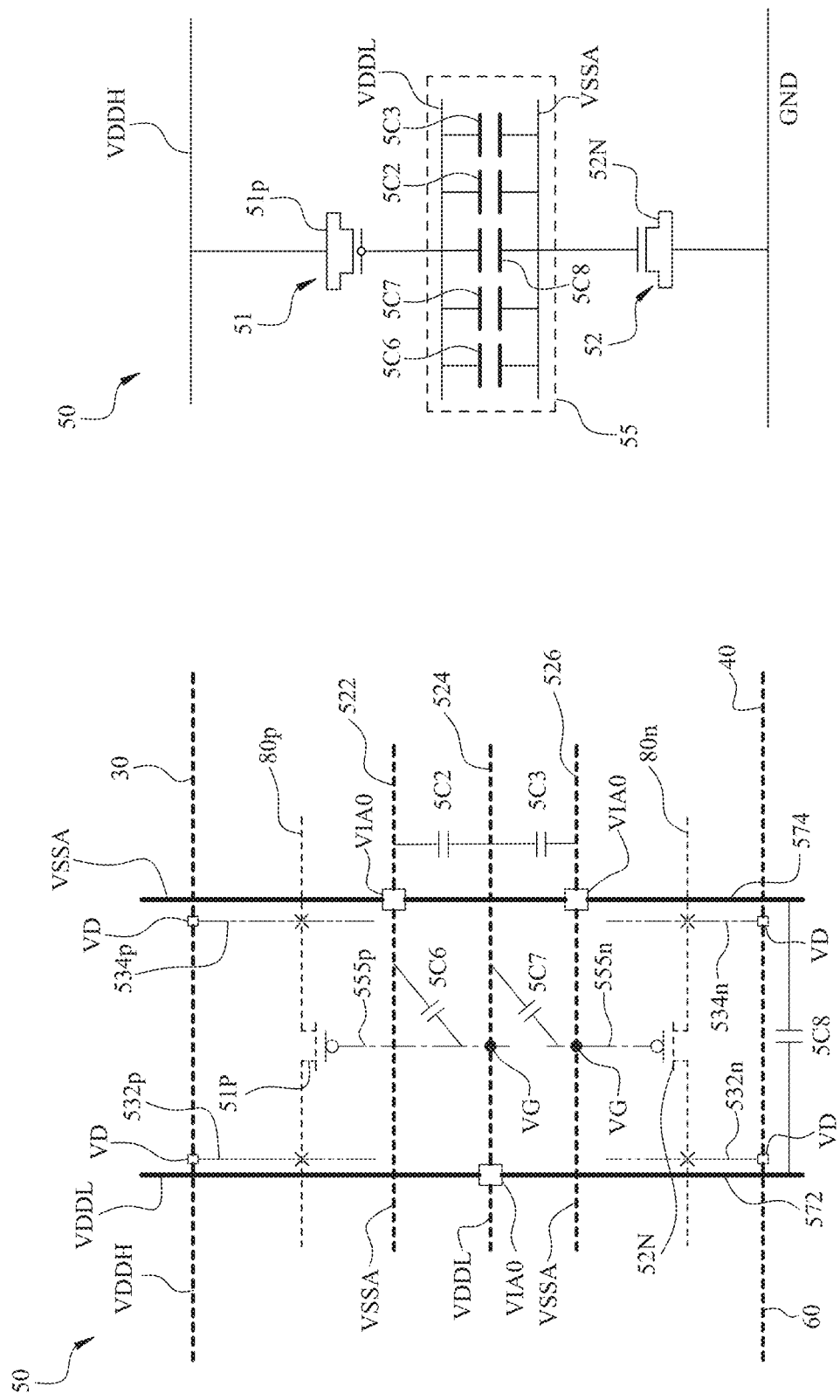
FIG. 5D is an equivalent circuit of the decoupling capacitor circuit specified by the layout diagrams in FIG. 5A, in accordance with some embodiments.
FIG. 5E is an equivalent circuit of the decoupling capacitor circuit of FIG. 5D, in accordance with some embodiments.

FIG. 5D is an equivalent circuit of the decoupling capacitor circuit 50 specified by the layout diagrams in FIG. 5A, in accordance with some embodiments. In FIG. 5D, the terminal-conductors 532p and 534p connect the source and the drain of the PMOS transistor 51P to the power rail for the power node 30 through the via-connectors VD, while the gate-conductor 555p connects the gate of the PMOS transistor 51P to the horizontal conducting line 524 through the via-connector VG. The gate-conductor 555n connects the gate of NMOS transistor 52N to the horizontal conducting line 526 through the via-connector VG, while the terminal-conductors 532n and 534n connect the source and the drain of the NMOS transistor 52N to the power rail 40 through the via-connectors VD. Furthermore, the horizontal conducting line 524 is connected to the vertical conducting line 572 through the via-connector VIA0, while each of the horizontal conducting lines 526 and 522 is connected to the vertical conducting line 574 through a corresponding via-connector VIA0.

In FIG. 5D, the power node 30 is configured to receive the upper voltage VDDH for the higher voltage domain, and the power rail 40 is connected to the ground voltage GND. The horizontal conducting line 524 and the vertical conducting line 572 are configured to receive the upper voltage VDDL for the lower voltage domain. The horizontal conducting lines 526 and 522 and the vertical conducting line 574 are configured to receive the alternative supply voltage VSSA for the lower voltage domain.

FIG. 5E is an equivalent circuit of the decoupling capacitor circuit 50 of FIG. 5D including the MIM capacitors for forming the metal-insulator-metal capacitor 55, in accordance with some embodiments. The metal-insulator-semiconductor capacitor 51 formed by the PMOS transistor 51P is connected between the upper voltage VDDH of the higher power domain and the upper voltage VDDL of the lower power domain. The metal-insulator-semiconductor capacitor 52 formed by the NMOS transistor 52N is connected between the alternative supply voltage VSSA for the lower voltage domain and the ground voltage GND. The metal-insulator-metal capacitor 55 formed by various MIM capacitors is connected between the upper voltage VDDL for the lower power domain and the alternative supply voltage VSSA for the lower voltage domain. The MIM capacitors for forming the metal-insulator-metal capacitor 55 include capacitors 5C2, 5C3, 5C6, 5C7, ad 5C8 as identified in FIG. 5D. The capacitors 5C2, 5C3, 5C6, 5C7, and 5C8 are all parallel-connected together. The capacitance value of the metal-insulator-metal capacitor 55 is the sum of the capacitance values of 5C2, 5C3, 5C6, 5C7, and 5C8.

In FIG. 5D, the capacitance between the horizontal conducting line 524 and the horizontal conducting line 522 is 5C2, while the capacitance between the horizontal conducting line 524 and the horizontal conducting line 526 is 5C3. The capacitance between the gate-conductor 555p and the horizontal conducting line 522 is 5C6, while the capacitance between the gate-conductor 555n and the horizontal conducting line 524 is 5C7. The capacitance between vertical conducting lines 572 and 574 is 5C8. In FIG. 5D, in addition to the MIM capacitors for forming the metal-insulator-metal capacitor 55 between the upper voltage VDDL and the alternative supply voltage VSSA, there are other MIM capacitors formed by various horizontal conducting lines, vertical conducting lines, gate-conductors, and/or the terminal conductors. The MIM capacitors which are not parts of the metal-insulator-metal capacitor 55 are not explicitly identified in FIG. 5D. The MIM capacitors which are not parts of the metal-insulator-metal capacitor 55 are not shown in the equivalent circuit of FIG. 5E.

In the layout design of FIG. 5A, the circuit cell of the decoupling capacitor circuit 50 is implemented between the power rail for the power node 30 maintained at the upper voltage VDDH for the higher voltage domain and the power rail 40 maintained at the ground voltage GND. In some embodiments, other circuit cells operating in the higher voltage domain are also implemented between the power rail for the power node 30 at the upper voltage VDDH and the power rail 40 at the ground voltage GND. In some alternative layout designs (such as in the layout design of FIG. 6A), the circuit cell of the decoupling capacitor circuit 50 is implemented between the power rail 20 maintained at the upper voltage VDDL for the lower voltage domain and the power rail 40 maintained at the ground voltage GND. In some embodiments, some logic cells operating in the lower voltage domain are also implemented between the power rail 20 at the upper voltage VDDL for the lower voltage domain and the power rail 40 at the ground voltage GND.

Figure 6A:
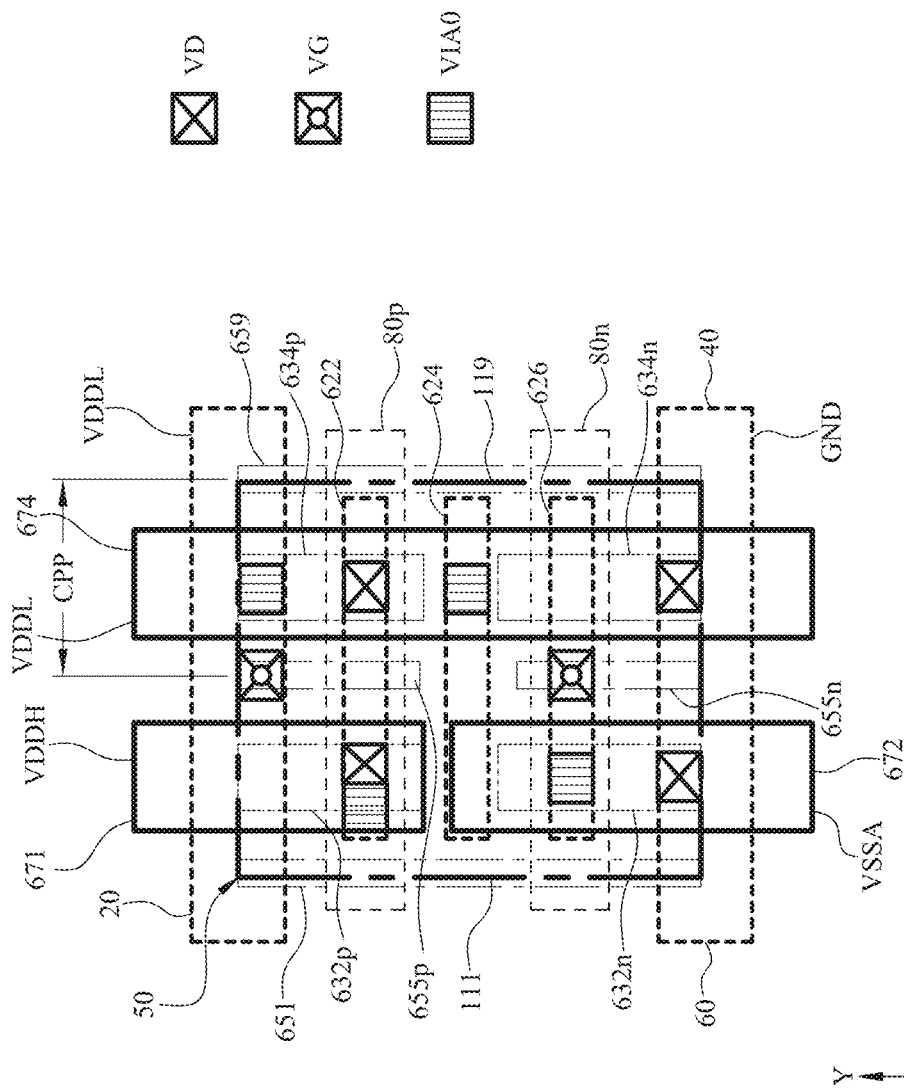
FIG. 6A is a layout diagram of the decoupling capacitor circuit, in accordance with some embodiments.

FIG. 6A is a layout diagram of the decoupling capacitor circuit 50 implemented between two power rails for the lower voltage domain, in accordance with some embodiments. FIG. 6B is an equivalent circuit of the decoupling capacitor circuit 50 as specified by the layout diagrams in FIG. 6A, in accordance with some embodiments. In FIG. 6A, the gate-conductor 655p intersects the active-region structure 80p at a channel region of the PMOS transistor 51P. Each of the terminal-conductors 632p and 634p intersects the active-region structure 80p at one of the source region and the drain region of the PMOS transistor 51P. The gate-conductor 655n intersects the active-region structure 80n at a channel region of the NMOS transistor 51N. Each of the terminal-conductors 632n and 634n intersects the active-region structure 80n at one of the source region and the drain region of the NMOS transistor 51N. The circuit cell in FIG. 6A is bounded along the X-direction by two vertical cell boundaries 111 and 119 extending in the Y-direction. In FIG. 6A, the layout patterns for the dummy gate-conductors 651 and 659 at the vertical cell boundaries 111 and 119 specify that each of the active-region structures 80p and 80n does not extend into adjacent cells.

In the layout diagram of FIG. 6A and the equivalent circuit of FIG. 6B, the horizontal conducting lines 622, 624, and 626 extending in the X-direction are fabricated in a first metal layer (such as metal layer M0). The power rails 20 and 40 extending in the X-direction are also fabricated in the first metal layer (such as metal layer M0). The vertical conducting lines 671, 672, and 674 extending in the Y-direction are fabricated in a second metal layer (such as metal layer M1) above the first metal layer.

Each of the terminal-conductors 632p and 634p is conductively connected to the horizontal conducting line 622 through a corresponding via-connector VD. The horizontal conducting line 622 is conductively connected to the vertical conducting line 671 through a corresponding via-connector VIA0. The vertical conducting lines 671 is configured to receive the upper voltage VDDH for the higher voltage domain.

The gate-conductor 655p is conductively connected to the power rail 20 through a corresponding via-connector VG. The power rail 20 is configured to receive the upper voltage VDDL for the lower voltage domain. Furthermore, the power rail 20 is conductively connected to the vertical conducting line 674 through a corresponding via-connector VIA0 atop the power rail 20, and the vertical conducting line 674 is conductively connected to the horizontal conducting line 624 through a corresponding via-connector VIA0 atop the horizontal conducting line 624. Consequently, each of the vertical conducting line 674 and the horizontal conducting line 624 is a part of the connection node for the upper voltage VDDL.

The gate-conductor 655n is conductively connected to the horizontal conducting line 626 through a corresponding via-connector VG. The horizontal conducting line 626 is conductively connected to the vertical conducting lines 672 through a corresponding via-connector VIA0. The vertical conducting lines 672 is configured to receive the alternative supply voltage VSSA for the lower voltage domain. Each of the terminal-conductors 632n and 634n is connected to the power rail 40 through a corresponding via-connector VD, and the power rail 40 is connected to the ground voltage GND.

Figure 6C:
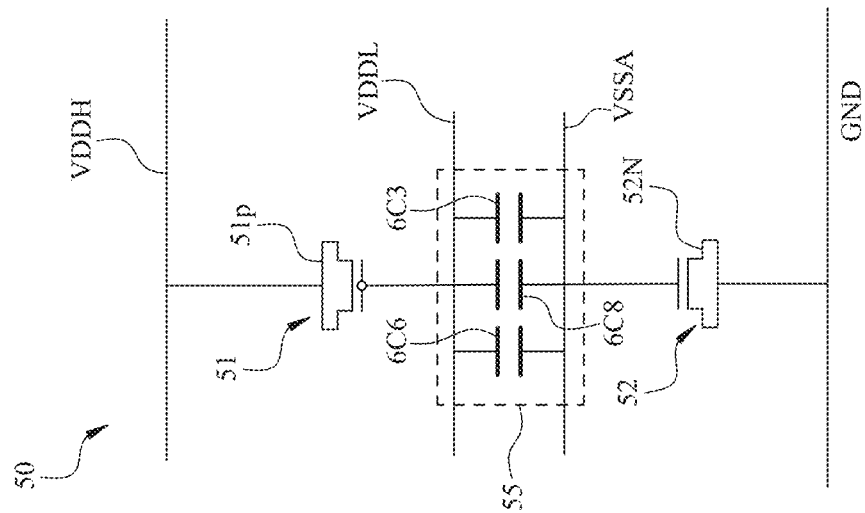
FIG. 6C is an equivalent circuit of the decoupling capacitor circuit of FIG. 6B, in accordance with some embodiments.
Figure 6B:
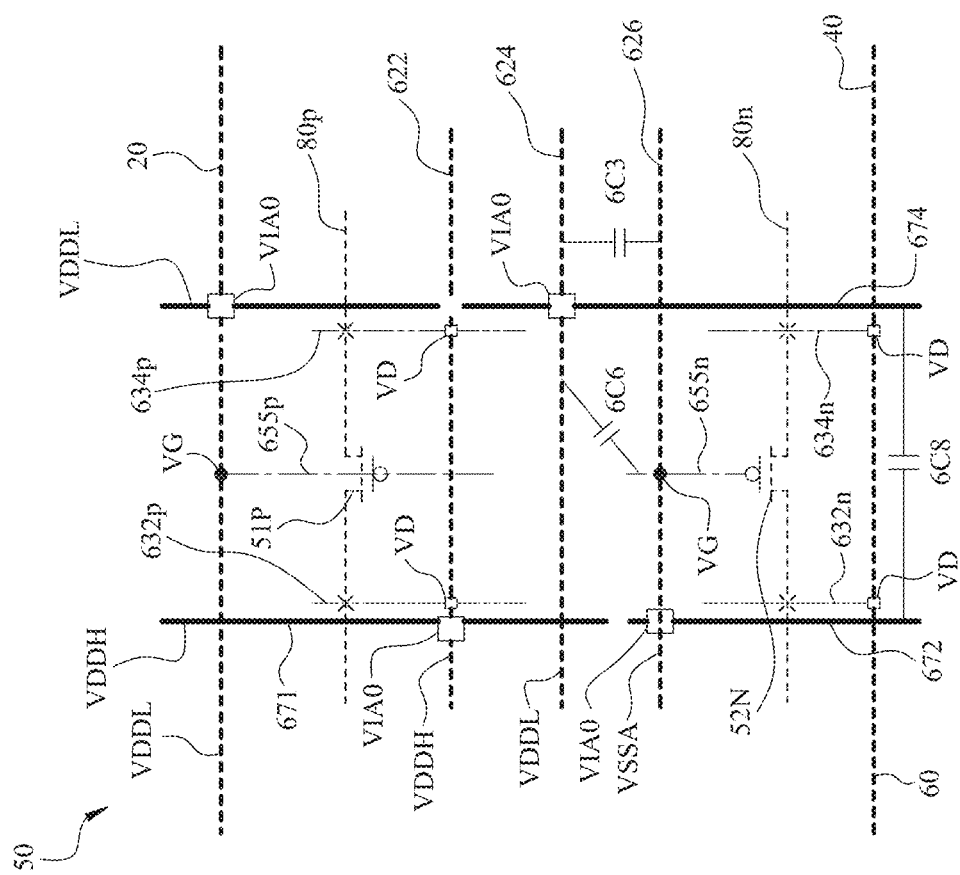
FIG. 6B is an equivalent circuit of the decoupling capacitor circuit as specified by the layout diagrams in FIG. 6A, in accordance with some embodiments.

FIG. 6C is an equivalent circuit of the decoupling capacitor circuit 50 of FIG. 6B including the MIM capacitors for forming the metal-insulator-metal capacitor 55, in accordance with some embodiments. The metal-insulator-semiconductor capacitor 51 formed by the PMOS transistor 51P is connected between the upper voltage VDDH of the higher power domain and the upper voltage VDDL of the lower power domain. The metal-insulator-semiconductor capacitor 52 formed by the NMOS transistor 52N is connected between the alternative supply voltage VSSA for the lower voltage domain and the ground voltage GND. The metal-insulator-metal capacitor 55 formed by various MIM capacitors is connected between the upper voltage VDDL of the lower power domain and the alternative supply voltage VSSA for the lower voltage domain. The MIM capacitors for forming the metal-insulator-metal capacitor 55 include capacitors 6C3, 6C6, and 6C8 as identified in FIG. 6B. The capacitors 6C3, 6C6, and 6C8 are all parallel-connected together between the connection node for the upper voltage VDDL and the connection node for the alternative supply voltage VSSA.

In FIG. 6B, the MIM capacitors for forming the metal-insulator-metal capacitor 55 between the upper voltage VDDL and the alternative supply voltage VSSA are identified. The capacitance between the horizontal conducting line 624 and the horizontal conducting line 626 is 6C3. The capacitance between the horizontal conducting line 624 and the gate-conductor 655n is 6C6. The capacitance between vertical conducting lines 672 and 674 is 6C8. There are other MIM capacitors in FIG. 6B formed by various horizontal conducting lines, vertical conducting lines, gate-conductors, and/or the terminal conductors. The MIM capacitors which are not parts of the metal-insulator-metal capacitor 55, however, are not explicitly identified in FIG. 6B.

Figure 7:
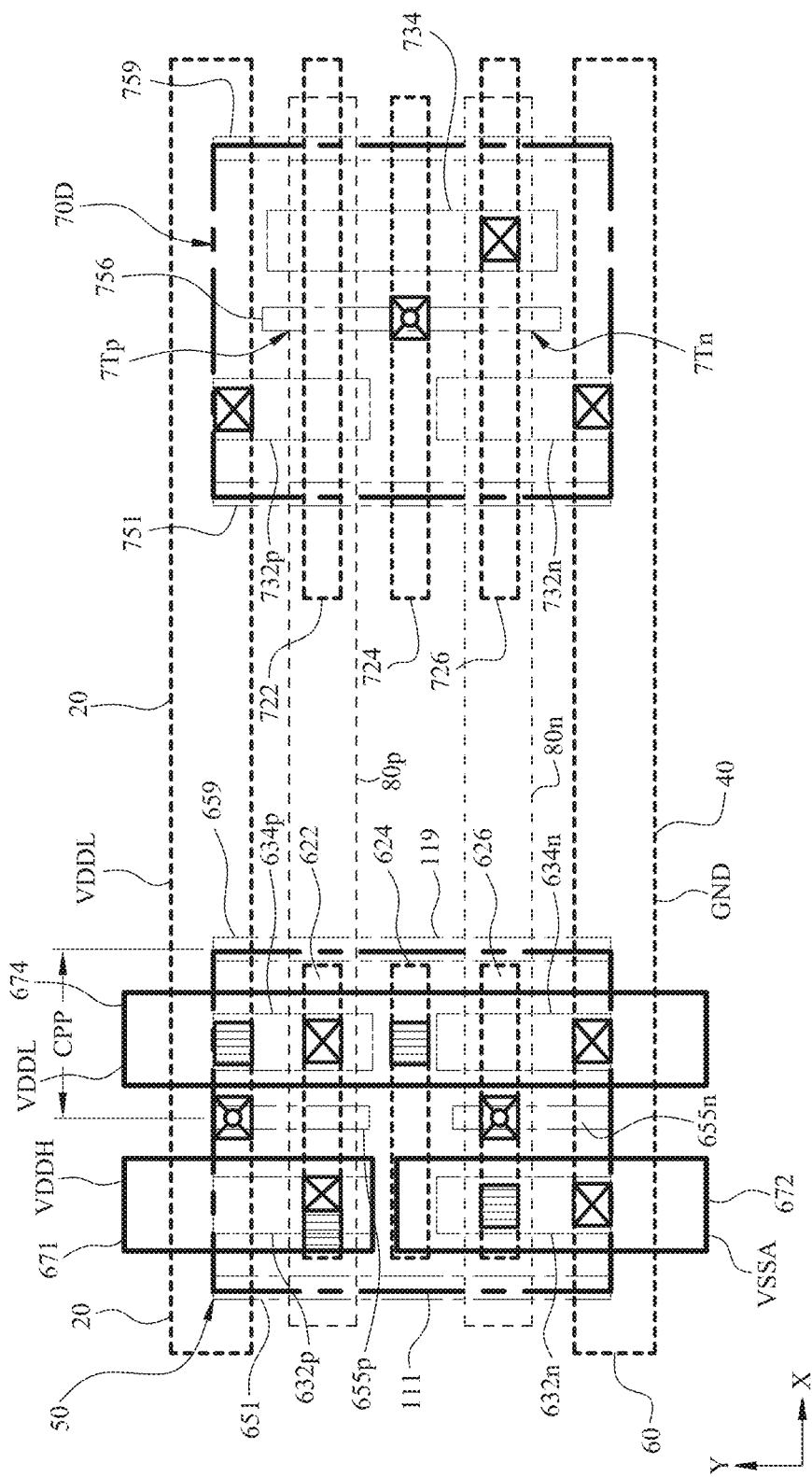
FIG. 7 is a layout diagram of the decoupling capacitor circuit and one logic cell, in accordance with some embodiments.

FIG. 7 is a layout diagram of the decoupling capacitor circuit 50 and one logic cell 70D which are implemented between two power rails for the lower voltage domain, in accordance with some embodiments. In FIG. 7, the layout design of the decoupling capacitor circuit 50 implemented between the power rails 20 and 40 is the same as the layout design of the decoupling capacitor circuit 50 in FIG. 6A. In addition to the decoupling capacitor circuit 50, an example layout design of the logic cell 70D is also depicted in FIG. 7. The logic cell 70D implemented between the power rails 20 and 40 is an inverter cell, which is bounded along the X-direction by the dummy gate-conductors 751 and 759 extending in the Y-direction.

In FIG. 7, the logic cell 70D includes a gate-conductor 756 and three terminal-conductors 732p, 732n, and 734 extending in the Y-direction. The gate-conductor 756 intersects an active-region structure 80p at a channel region of the PMOS transistor 7Tp and intersects an active-region structure 80n at a channel region of the NMOS transistor 7Tn. The terminal-conductor 732p intersects the active-region structure 80p at the source region of the PMOS transistor 7Tp and conductively connects to the power rail 20 through a corresponding via-connector VD. The terminal-conductor 732n intersects the active-region structure 80n at the source region of the NMOS transistor 7Tn and conductively connects to the power rail 40 through a corresponding via-connector VD. The terminal-conductor 734 intersects the active-region structure 80p at the drain region of the PMOS transistor 7Tp and intersects the active-region structure 80n at the drain region of the NMOS transistor 7Tn. The horizontal conducting line 724 in the first metal layer is conductively connected to the gate-conductor 756 through a via-connector VG. The horizontal conducting line 726 in the first metal layer is conductively connected to the terminal-conductor 734 through a via-connector VD. The horizontal conducting line 726 in the first metal layer passes through the logic cell 70D and is not conductively connected to any contact nodes in the logic cell 70D. The horizontal conducting line 724 functions as an input pin of the inverter, and the horizontal conducting line 726 functions as an output pin of the inverter.

In FIG. 7, only an example layout design of the logic cell 70D is depicted. In other embodiments, however, in addition to the decoupling capacitor circuit 50, two or more logic cells are implemented between the power rails 20 and 40. For example, in FIGS. 1A-1D and FIGS. 3A-3D, the logic cells implemented between the power rail 20 and the power rail 40 include the logic cells 70A-70D.

Figure 8:
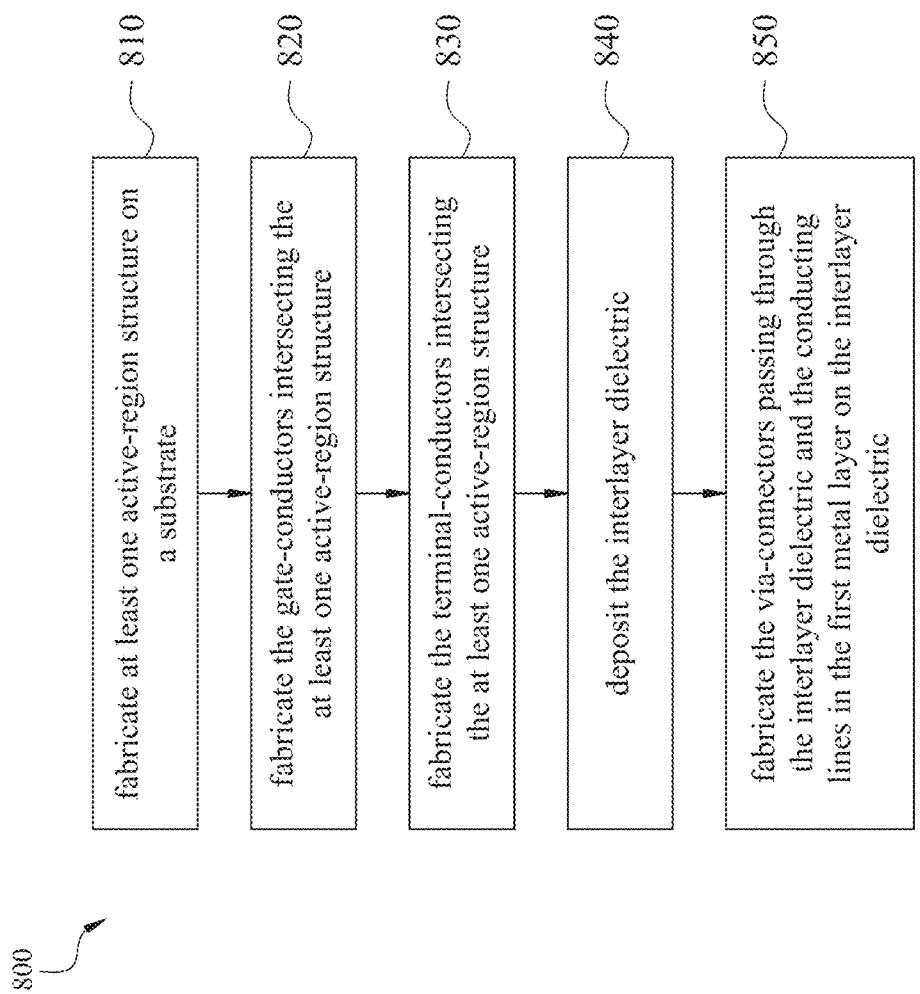
FIG. 8 is a flowchart of a method of manufacturing an integrated circuit, in accordance with some embodiments.

FIG. 8 is a flowchart of a method 800 of manufacturing an integrated circuit, in accordance with some embodiments. The sequence in which the operations of method 800 are depicted in FIG. 8 is for illustration only; the operations of method 800 are capable of being executed in sequences that differ from that depicted in FIG. 8. It is understood that additional operations may be performed before, during, and/or after the method 800 depicted in FIG. 8, and that some other processes may only be briefly described herein.

In operation 810 of method 800, at least one active-region structure is fabricated on a substrate. In a first example embodiment as shown in FIGS. 4A-4F, the active-region structure 80n extending in the X-direction is fabricated on the substrate 90. In a second example embodiment as shown in FIGS. 5A, 5B1-5B3, and 5C1-5C2, the active-region structure 80p and the active-region structure 80n are fabricated on the substrate 90. Each of the active-region structure 80p and the active-region structure 80n extends in the X-direction. Examples of the active-region structures fabricated in operation 810 include fin structures, nano-sheet structures, and nano-wire structures.

In operation 820 of method 800, the gate-conductors intersecting the at least one active-region structure are fabricated. In the first example embodiment as shown in FIGS. 4A-4F, the gate-conductors 453A and 457B extending in the Y-direction are fabricated. The gate-conductor 453A intersects the first part of the active-region structure 80n at the n-type channel region of the NMOS transistor 51N. The gate-conductor 457B intersects the second part of the active-region structure 80n at the n-type channel region of the NMOS transistor 52N. In the second example embodiment as shown in FIGS. 5A, 5B1-5B3, and 5C1-5C2, the gate-conductors 555p and 555n extending in the Y-direction are fabricated. The gate-conductor 555p intersects the active-region structure 80p at a p-type channel region of the PMOS transistor 51P. The gate-conductor 555n intersects the active-region structure 80n at an n-type channel region of the NMOS transistor 52N.

In operation 830 of method 800, the terminal-conductors intersecting the at least one active-region structure are fabricated. In the first example embodiment as shown in FIGS. 4A-4F, terminal-conductors 432A, 434A, 436B, and 438B extending in the Y-direction are fabricated. Each of the terminal-conductors 432A and 434A intersects the active-region structure 80n at one of the source region and the drain region of the NMOS transistor 51N. Each of the terminal-conductors 436B and 438B intersects the active-region structure 80n at one of the source region and the drain region of the NMOS transistor 52N. In the second example embodiment as shown in FIGS. 5A, 5B1-5B3, and 5C1-5C2, terminal-conductors 532p, 532n. 534p, and 534n extending in the Y-direction are fabricated. Each of the terminal-conductors 532p and 534p intersects the active-region structure 80p at one of the source region and the drain region of the PMOS transistor 51P. Each of the terminal-conductors 532n and 534n intersects the active-region structure 80n at one of the source region and the drain region of the NMOS transistor 52N.

In operation 840 of method 800, the interlayer dielectric is deposited covering the gate-conductors and the terminal-conductors. In the first example embodiment as shown in FIGS. 4A-4F, the interlayer dielectric 92 is deposited covering the gate-conductors 453A and 457B and covering the terminal-conductors 432A, 434A, 436B, and 438B. In the second example embodiment as shown in FIGS. 5A, 5B1-5B3, and 5C1-5C2, the interlayer dielectric 92 is deposited covering the gate-conductors 555p and 555n and covering the terminal-conductors 532p, 532n, 534p, and 534n.

In operation 850 of method 800, via-connectors passing through the interlayer dielectric and conducting lines in the first metal layer on the interlayer dielectric are fabricated. In the first example embodiment as shown in FIGS. 4A-4F, the fabricated via-connectors passing through the interlayer dielectric 92 include the via-connectors VD that connect the horizontal conducting line 424A to the terminal-conductors 432A and 434A. In FIGS. 4A-4F, the fabricated via-connectors passing through the interlayer dielectric 92 incudes the via-connectors VG that connect the gate-conductor 457B to the horizontal conducting lines 424B and 428B. In the second example embodiment as shown in FIGS. 5A, 5B1-5B3, and 5C1-5C2, the fabricated via-connectors passing through the interlayer dielectric 92 include the via-connectors VD that connect the power rail of the power node 30 to the terminal-conductors 532p and 534p, the via-connectors VD that connect the power node 60 (in the form of a power rail) to the terminal-conductors 532n and 534n, the via-connector VG that connects the gate-conductor 555p to the horizontal conducting line 524, and the via-connector VG that connects the gate-conductor 555n to the horizontal conducting line 526. In FIGS. 5A, 5B1-5B3, and 5C1-5C2, the horizontal conducting line 524 is fabricated as a first conducting line connected the gate of the PMOS transistor 51P, the horizontal conducting line 526 is fabricated as a second conducting line connected the gate of the NMOS transistor 52N, the power node 30 in the form of a power line is fabricated as a third conducting line connected to the source and the drain of the PMOS transistor 51P, and the power node 60 in the form of a power line is fabricated as a fourth conducting line connected to the source and the drain of the NMOS transistor 52N.

Figure 9:
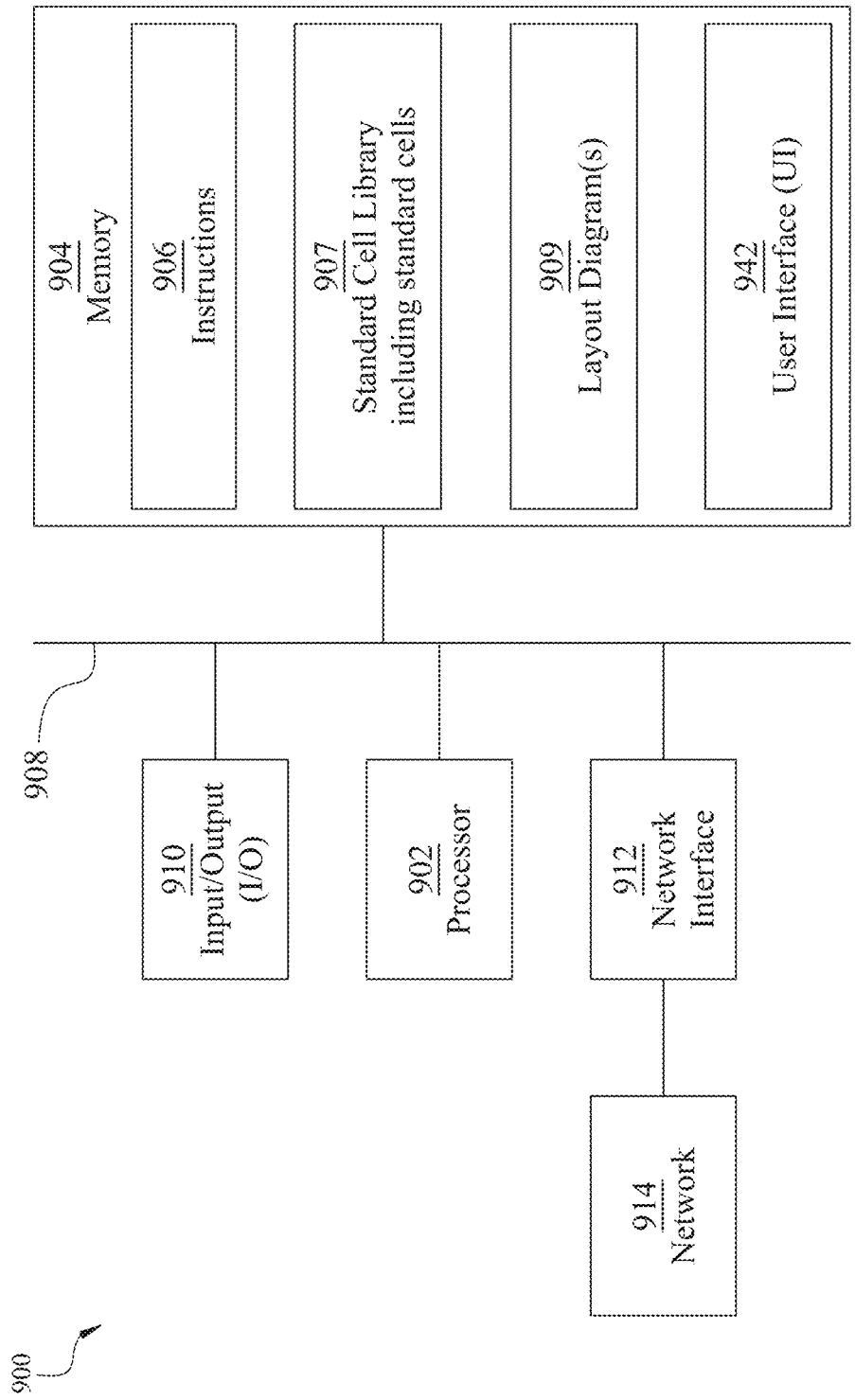
FIG. 9 is a block diagram of an electronic design automation (EDA) system in accordance with some embodiments.

FIG. 9 is a block diagram of an electronic design automation (EDA) system 900 in accordance with some embodiments.

In some embodiments, EDA system 900 includes an APR system. Methods described herein of designing layout diagrams represent wire routing arrangements, in accordance with one or more embodiments, are implementable, for example, using EDA system 900, in accordance with some embodiments.

In some embodiments, EDA system 900 is a general purpose computing device including a hardware processor 902 and a non-transitory, computer-readable storage medium 904. Storage medium 904, amongst other things, is encoded with, i.e., stores, computer program code 906, i.e., a set of executable instructions. Execution of instructions 906 by hardware processor 902 represents (at least in part) an EDA tool which implements a portion or all of the methods described herein in accordance with one or more embodiments (hereinafter, the noted processes and/or methods).

Processor 902 is electrically coupled to computer-readable storage medium 904 via a bus 908. Processor 902 is also electrically coupled to an I/O interface 910 by bus 908. A network interface 912 is also electrically connected to processor 902 via bus 908. Network interface 912 is connected to a network 914, so that processor 902 and computer-readable storage medium 904 are capable of connecting to external elements via network 914. Processor 902 is configured to execute computer program code 906 encoded in computer-readable storage medium 904 in order to cause system 900 to be usable for performing a portion or all of the noted processes and/or methods. In one or more embodiments, processor 902 is a central processing unit (CPU), a multi-processor, a distributed processing system, an application specific integrated circuit (ASIC), and/or a suitable processing unit.

In one or more embodiments, computer-readable storage medium 904 is an electronic, magnetic, optical, electromagnetic, infrared, and/or a semiconductor system (or apparatus or device). For example, computer-readable storage medium 904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 904 includes a compact disk-read only memory (CD-ROM), a compact disk-read/write (CD-R/W), and/or a digital video disc (DVD).

In one or more embodiments, storage medium 904 stores computer program code 906 configured to cause system 900 (where such execution represents (at least in part) the EDA tool) to be usable for performing a portion or all of the noted processes and/or methods. In one or more embodiments, storage medium 904 also stores information which facilitates performing a portion or all of the noted processes and/or methods. In one or more embodiments, storage medium 904 stores library 907 of standard cells including such standard cells as disclosed herein. In one or more embodiments, storage medium 904 stores one or more layout diagrams 909 corresponding to one or more layouts disclosed herein.

EDA system 900 includes I/O interface 910. I/O interface 910 is coupled to external circuitry. In one or more embodiments, I/O interface 910 includes a keyboard, keypad, mouse, trackball, trackpad, touchscreen, and/or cursor direction keys for communicating information and commands to processor 902.

EDA system 900 also includes network interface 912 coupled to processor 902. Network interface 912 allows system 900 to communicate with network 914, to which one or more other computer systems are connected. Network interface 912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 900.

System 900 is configured to receive information through I/O interface 910. The information received through I/O interface 910 includes one or more of instructions, data, design rules, libraries of standard cells, and/or other parameters for processing by processor 902. The information is transferred to processor 902 via bus 908. EDA system 900 is configured to receive information related to a UI through I/O interface 910. The information is stored in computer-readable medium 904 as user interface (UI) 942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 10:
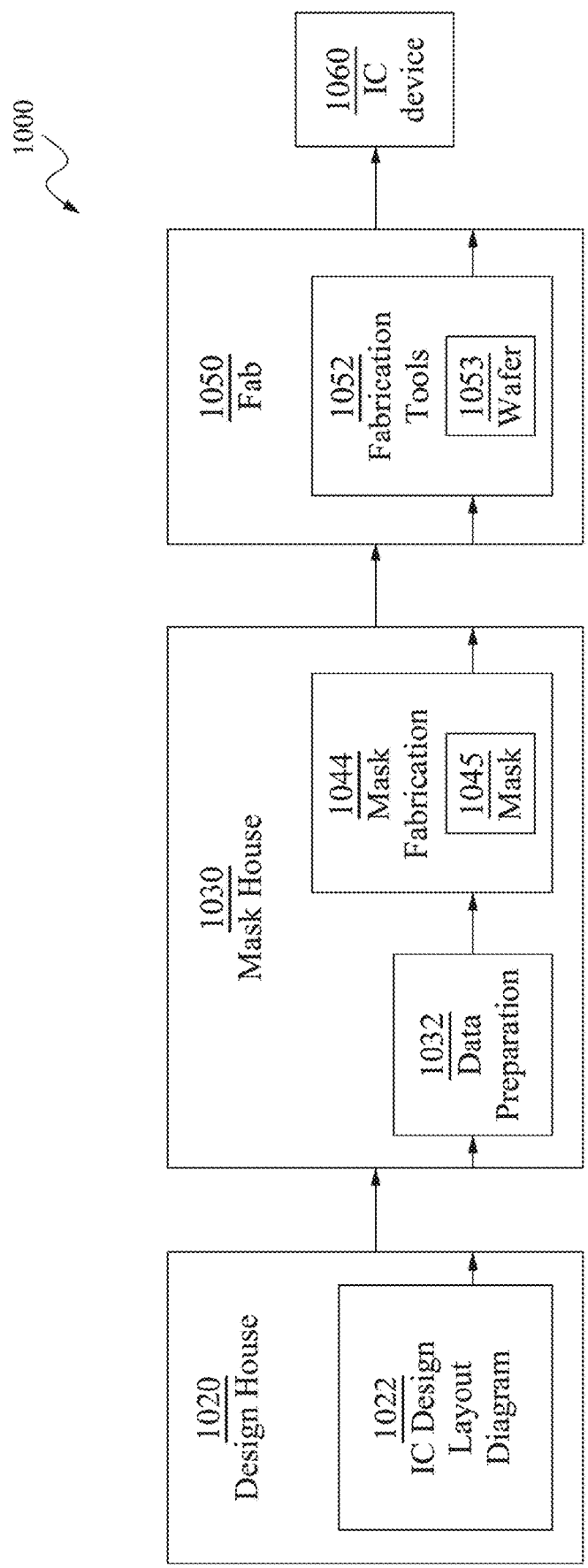
FIG. 10 is a block diagram of an integrated circuit (IC) manufacturing system, and an IC manufacturing flow associated therewith, in accordance with some embodiments.

FIG. 10 is a block diagram of an integrated circuit (IC) manufacturing system 1000, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1000.

In FIG. 10, IC manufacturing system 1000 includes entities, such as a design house 1020, a mask house 1030, and an IC manufacturer/fabricator ("fab") 1050, that interact with one another in the design, development, and manufacturing cycles and/or services related to manufacturing an IC device 1060. The entities in system 1000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1020, mask house 1030, and IC fab 1050 is owned by a single larger company. In some embodiments, two or more of design house 1020, mask house 1030, and IC fab 1050 coexist in a common facility and use common resources.

Design house (or design team) 1020 generates an IC design layout diagram 1022. IC design layout diagram 1022 includes various geometrical patterns designed for an IC device 1060. The geometrical patterns correspond to patterns of metal, oxide, or semiconductor layers that make up the various components of IC device 1060 to be fabricated. The various layers combine to form various IC features. For example, a portion of IC design layout diagram 1022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1020 implements a proper design procedure to form IC design layout diagram 1022. The design procedure includes one or more of logic design, physical design or place and route. IC design layout diagram 1022 is presented in one or more data files having information of the geometrical patterns. For example, IC design layout diagram 1022 can be expressed in a GDSII file format or DFII file format.

Mask house 1030 includes data preparation 1032 and mask fabrication 1044. Mask house 1030 uses IC design layout diagram 1022 to manufacture one or more masks 1045 to be used for fabricating the various layers of IC device 1060 according to IC design layout diagram 1022. Mask house 1030 performs mask data preparation 1032, where IC design layout diagram 1022 is translated into a representative data file ("RDF"). Mask data preparation 1032 provides the RDF to mask fabrication 1044. Mask fabrication 1044 includes a mask writer. A mask writer converts the RDF to an image on a substrate, such as a mask (reticle) 1045 or a semiconductor wafer 1053. The design layout diagram 1022 is manipulated by mask data preparation 1032 to comply with particular characteristics of the mask writer and/or requirements of IC fab 1050. In FIG. 10, mask data preparation 1032 and mask fabrication 1044 are illustrated as separate elements. In some embodiments, mask data preparation 1032 and mask fabrication 1044 can be collectively referred to as mask data preparation.

In some embodiments, mask data preparation 1032 includes optical proximity correction (OPC) which uses lithography enhancement techniques to compensate for image errors, such as those that can arise from diffraction, interference, other process effects and the like. OPC adjusts IC design layout diagram 1022. In some embodiments, mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during mask fabrication 1044, which may undo part of the modifications performed by OPC in order to meet mask creation rules.

In some embodiments, mask data preparation 1032 includes lithography process checking (LPC) that simulates processing that will be implemented by IC fab 1050 to fabricate IC device 1060. LPC simulates this processing based on IC design layout diagram 1022 to create a simulated manufactured device, such as IC device 1060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to IC design layout diagram 1022 during data preparation 1032 may be executed in a variety of different orders.

After mask data preparation 1032 and during mask fabrication 1044, a mask 1045 or a group of masks 1045 are fabricated based on the modified IC design layout diagram 1022. In some embodiments, mask fabrication 1044 includes performing one or more lithographic exposures based on IC design layout diagram 1022. In some embodiments, an electron-beam (e-beam) or a mechanism of multiple e-beams is used to form a pattern on a mask (photomask or reticle) 1045 based on the modified IC design layout diagram 1022. Mask 1045 can be formed in various technologies. In some embodiments, mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1045 includes a transparent substrate (e.g., fused quartz) and an opaque material (e.g., chromium) coated in the opaque regions of the binary mask. In another example, mask 1045 is formed using a phase shift technology. In a phase shift mask (PSM) version of mask 1045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1044 is used in a variety of processes. For example, such a mask(s) is used in an ion implantation process to form various doped regions in semiconductor wafer 1053, in an etching process to form various etching regions in semiconductor wafer 1053, and/or in other suitable processes.

IC fab 1050 is an IC fabrication business that includes one or more manufacturing facilities for the fabrication of a variety of different IC products. In some embodiments, IC Fab 1050 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1050 includes fabrication tools 1052 configured to execute various manufacturing operations on semiconductor wafer 1053 such that IC device 1060 is fabricated in accordance with the mask(s), e.g., mask 1045. In various embodiments, fabrication tools 1052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1050 uses mask(s) 1045 fabricated by mask house 1030 to fabricate IC device 1060. Thus, IC fab 1050 at least indirectly uses IC design layout diagram 1022 to fabricate IC device 1060. In some embodiments, semiconductor wafer 1053 is fabricated by IC fab 1050 using mask(s) 1045 to form IC device 1060. In some embodiments, the IC fabrication includes performing one or more lithographic exposures based at least indirectly on IC design layout diagram 1022. Semiconductor wafer 1053 includes a silicon substrate or other proper substrate having material layers formed thereon. Semiconductor wafer 1053 further includes one or more of various doped regions, dielectric features, multi-level interconnects, and the like (formed at subsequent manufacturing steps).

Details regarding an integrated circuit (IC) manufacturing system (e.g., system 1000 of FIG. 10), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to a method. The method includes fabricating a first transistor and a second transistor on a substrate. The method also includes fabricating a first conducting line in a first metal layer and connecting a gate of the first transistor to the first conducting line configured to receive a first supply voltage for a lower voltage domain. The method also includes fabricating a second conducting line in the first metal layer and connecting a gate of the second transistor to the second conducting line configured to receive an alternative supply voltage. The first conducting line and the second conducting line are parallel and adjacent to each other in the first metal layer above the first transistor and the second transistor. The method still includes connecting a source and a drain of the first transistor to a third conducting line configured to receive a first reference voltage for a higher voltage domain, and connecting a source and a drain of the second transistor to a fourth conducting line configured to receive a second reference voltage for the higher voltage domain.

Another aspect of the present disclosure relates to a method. The method includes fabricating a first transistor and a second transistor on a substrate. The method also includes fabricating a first conducting line in a first metal layer and connecting a source and a drain of the first transistor to the first conducting line configured to receive a first voltage for a lower voltage domain. The method also includes fabricating a second conducting line in the first metal layer and connecting a gate of the second transistor to the second conducting line configured to a second voltage for the lower voltage domain. The first conducting line and the second conducting line are parallel and adjacent to each other in the first metal layer above the first transistor and the second transistor. The method still includes connecting a gate of the first transistor to a first power node configured to receive a first reference voltage for a higher voltage domain, and connecting a source and a drain of the second transistor to a second power node configured to receive a second reference voltage for the higher voltage domain.

Another aspect of the present disclosure still relates to a method. The method includes fabricating a first metal-insulator-semiconductor capacitor and fabricating a second metal-insulator-semiconductor capacitor. The method also includes fabricating a metal-insulator-metal capacitor having a first terminal conductively connected to a second terminal of the first metal-insulator-semiconductor capacitor and having a second terminal conductively connected to a second terminal of the second metal-insulator-semiconductor capacitor. The method further includes connecting a first power rail to the first terminal of the metal-insulator-metal capacitor, connecting a second power rail to the first terminal of the second metal-insulator-semiconductor capacitor, and connecting a plurality of logic cells in a lower voltage domain between the first power rail and the second power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   fabricating a first transistor and a second transistor on a substrate;
   fabricating a first conducting line in a first metal layer and connecting a gate of the first transistor to the first conducting line configured to receive a first supply voltage for a lower voltage domain;
   fabricating a second conducting line in the first metal layer and connecting a gate of the second transistor to the second conducting line configured to receive an alternative supply voltage, wherein the first conducting line and the second conducting line are parallel and adjacent to each other in the first metal layer above the first transistor and the second transistor, and wherein the first conducting line and the second conducting line form a metal-insulator-metal capacitor connected between the gate of the first transistor and the gate of the second transistor;
   connecting a source and a drain of the first transistor to a third conducting line configured to receive a first reference voltage for a higher voltage domain; and
   connecting a source and a drain of the second transistor to a fourth conducting line configured to receive a second reference voltage for the higher voltage domain.

2. The method of claim 1, wherein fabricating the first transistor and the second transistor comprises;
   fabricating a first active-region structure and a second active-region structure on the substrate;
   fabricating a first gate-conductor intersecting the first active-region structure at a channel region of the first transistor; and
   fabricating a second gate-conductor intersecting the second active-region structure at a channel region of the second transistor.

3. The method of claim 2, further comprising:
   connecting the gate of the first transistor to the first conducting line comprises connecting the first gate-conductor to the first conducting line through a first via-connector; and
   connecting the gate of the second transistor to the second conducting line comprises connecting the second gate-conductor to the second conducting line through a second via-connector.

4. The method of claim 2, further comprising:
   fabricating a first terminal-conductor and a second terminal-conductor intersecting the first active-region structure correspondingly at a source region and a drain region of the first transistor, and connecting each of the first terminal-conductor and the second terminal-conductor to the third conducting line through a corresponding via-connector; and fabricating a third terminal-conductor and a fourth terminal-conductor intersecting the second active-region structure correspondingly at a source region and a drain region of the second transistor, and connecting each of the third terminal-conductor and the fourth terminal-conductor to the fourth conducting line through a corresponding via-connector.

5. A method comprising:
fabricating a first transistor and a second transistor on a substrate;
fabricating a first conducting line in a first metal layer and connecting a source and a drain of the first transistor to the first conducting line configured to receive a first voltage for a lower voltage domain;
fabricating a second conducting line in the first metal layer and connecting a gate of the second transistor to the second conducting line configured to a second voltage for the lower voltage domain, wherein the first conducting line and the second conducting line are parallel and adjacent to each other in the first metal layer above the first transistor and the second transistor, and wherein the first conducting line and the second conducting line form a metal-insulator-metal capacitor connected between the source of the first transistor and the gate of the second transistor;
connecting a gate of the first transistor to a first power node configured to receive a first reference voltage for a higher voltage domain; and
connecting a source and a drain of the second transistor to a second power node configured to receive a second reference voltage for the higher voltage domain.

6. The method of claim 5, wherein fabricating the first transistor and the second transistor comprises;
connecting the gate of the first transistor to a third conducting line configured to receive the first reference voltage for the higher voltage domain; and
connecting the source and the drain of the second transistor to a fourth conducting line configured to receive the second reference voltage for the higher voltage domain.

7. The method of claim 5, wherein fabricating the first transistor and the second transistor comprises;
fabricating an active-region structure on the substrate;
fabricating a first gate-conductor intersecting the active-region structure at an n-type channel region of the first transistor;
fabricating a second gate-conductor intersecting the active-region structure at an n-type channel region of the second transistor;
wherein the first reference voltage is an upper voltage for the higher voltage domain, and the second reference voltage is a lower voltage for the higher voltage domain; and
wherein the first voltage is an upper voltage for the lower voltage domain, and the second reference voltage is between the upper voltage for the lower voltage domain and a lower voltage for the lower voltage domain.

8. The method of claim 7, comprising:
fabricating a first power rail conductively connected to the first conducting line.

9. The method of claim 5, wherein fabricating the first transistor and the second transistor comprises;
fabricating an active-region structure on the substrate;
fabricating a first gate-conductor intersecting the active-region structure at a p-type channel region of the first transistor;
fabricating a second gate-conductor intersecting the active-region structure at a p-type channel region of the second transistor;
wherein the first reference voltage is a lower voltage for the higher voltage domain, and the second reference voltage is an upper voltage for the higher voltage domain; and
wherein the second voltage is an upper voltage for the lower voltage domain, and the first voltage is between the upper voltage for the lower voltage domain and a lower voltage for the lower voltage domain.

10. A method comprising:
fabricating a first metal-insulator-semiconductor capacitor;
fabricating a second metal-insulator-semiconductor capacitor;
fabricating a metal-insulator-metal capacitor having a first terminal conductively connected to a second terminal of the first metal-insulator-semiconductor capacitor and having a second terminal conductively connected to a second terminal of the second metal-insulator-semiconductor capacitor, wherein fabricating the metal-insulator-metal capacitor comprises fabricating a first conducting line in a first metal layer and fabricating a second conducting line in the first metal layer, and wherein the first conducting line and the second conducting line are parallel and adjacent to each other in the first metal layer above the first metal-insulator-semiconductor capacitor and the second metal-insulator-semiconductor capacitor;
connecting a first power rail to the first terminal of the metal-insulator-metal capacitor;
connecting a second power rail to the first terminal of the second metal-insulator-semiconductor capacitor; and
connecting a plurality of logic cells in a lower voltage domain between the first power rail and the second power rail.

11. The method of claim 10, further comprising:
applying a first reference voltage for a higher voltage domain to a first terminal of a first metal-insulator-semiconductor capacitor.

12. The method of claim 10, further comprising:
applying a second reference voltage for a higher voltage domain to a first terminal of a second metal-insulator-semiconductor capacitor.

13. The method of claim 10, further comprising:
applying a first supply voltage for the lower voltage domain to the first terminal of the first metal-insulator-metal capacitor.

14. The method of claim 10, further comprising:
applying a second supply voltage for the lower voltage domain to the first terminal of the second metal-insulator-semiconductor capacitor.

15. The method of claim 10, further comprising:
applying an alternative supply voltage for a lower voltage domain to the second terminal of the first terminal of the second metal-insulator-semiconductor capacitor.

16. The method of claim 10, further comprising:
connecting a level shifter to both the first power rail and the first terminal of the first metal-insulator-semiconductor capacitor.

17. The method of claim 10, further comprising:
connecting a third power rail conductively connected to the second terminal of the metal-insulator-metal capacitor that is configured to have an alternative supply voltage for the lower voltage domain.

18. The method of claim 10, wherein the first metal-insulator-semiconductor capacitor is formed with a PMOS transistor, and the second metal-insulator-semiconductor capacitor is formed with an NMOS transistor.

19. The method of claim 10, wherein the first metal-insulator-semiconductor capacitor is formed with a first NMOS transistor, and the second metal-insulator-semiconductor capacitor is formed with a second NMOS transistor.

20. The method of claim 10, wherein the first metal-insulator-semiconductor capacitor is formed with a first PMOS transistor, and the second metal-insulator-semiconductor capacitor is formed with a second PMOS transistor.

* * * * *